United States Patent
Umeda et al.

(10) Patent No.: US 6,798,499 B2
(45) Date of Patent: Sep. 28, 2004

(54) METHOD OF FORMING OPTICAL THIN FILMS ON SUBSTRATE AT HIGH ACCURACY AND APPARATUS THEREFOR

(75) Inventors: Yuichi Umeda, Miyagi-ken (JP); Yoshihiro Someno, Miyagi-ken (JP); Tokio Isago, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/194,849

(22) Filed: Jul. 11, 2002

(65) Prior Publication Data

US 2003/0016346 A1 Jan. 23, 2003

(30) Foreign Application Priority Data

Jul. 18, 2001 (JP) ...................................... 2001-218599
Jul. 18, 2001 (JP) ...................................... 2001-218600

(51) Int. Cl.[7] ......................... G01N 21/00; G01B 11/28
(52) U.S. Cl. ......................................... 356/72; 356/630
(58) Field of Search .......................... 356/72, 630, 381, 356/382, 432, 437, 128; 427/10, 567

(56) References Cited

U.S. PATENT DOCUMENTS

| 4,311,725 A | 1/1982 | Holland ........................ 427/10 |
| 5,028,136 A | * 7/1991 | Murarka et al. ............. 356/485 |
| 5,354,575 A | * 10/1994 | Dagenais et al. .............. 427/10 |
| 5,739,910 A | * 4/1998 | Castor ......................... 356/369 |
| 5,911,856 A | 6/1999 | Suzuki et al. ........... 204/192.13 |
| 6,466,308 B1 | * 10/2002 | Jaing et al. ................. 356/35.5 |
| 2001/0038456 A1 | * 11/2001 | Yakshin et al. ............. 356/630 |
| 2002/0008891 A1 | 1/2002 | Mearini et al. ............. 359/124 |
| 2002/0176097 A1 | * 11/2002 | Rodgers ...................... 356/630 |

FOREIGN PATENT DOCUMENTS

| EP | 0 712 942 A1 | 5/1996 | ........... C23C/14/54 |
| EP | 1 148 149 A2 | 10/2001 | ........... C23C/14/54 |
| GB | 2 246 905 A | 2/1992 | ........... H01S/3/025 |

* cited by examiner

Primary Examiner—Michael P. Stafira
(74) Attorney, Agent, or Firm—Beyer Weaver & Thomas, LLP

(57) ABSTRACT

An apparatus for depositing an optical thin film at a high accuracy has a vacuum chamber in which a thin film is formed on a substrate by vapor deposition of a material at a target using ion beams from an ion gun, an optical monitor for optically measuring the thickness of the thin film and outputting transmittance data DT, a crystal monitor for measuring a frequency which changes as the deposition proceeds and for outputting frequency data DF, and a determination circuit 12. The determination circuit select between the optical monitor and the crystal monitor to control the thickness of the thin film to be formed on the substrate.

20 Claims, 14 Drawing Sheets

METHOD OF FORMING OPTICAL THIN FILMS ON SUBSTRATE AT HIGH ACCURACY AND APPARATUS THEREFOR

BACKGROUND OF THE INVENTION

1. Field of the Invention

The present invention relates to a method for forming a plurality of optical thin-films for an optical device on a substrate at a high accuracy, and to an apparatus therefor.

2. Description of the Related Art

Optical communications using optical fibers have seen rapid development in recent years. Optical devices, such as various filters, used in optical communications are required to achieve high performance, i.e., highly accurate optical characteristics, to meet this development.

In order to satisfy such a requirement, it is essential to accurately control the thicknesses of layers deposited on a substrate during making a multilayer thin film for use in an optical device.

FIG. 20 shows a conventional deposition apparatus used in making optical thin films that require highly accurate thickness control. The deposition apparatus shown in FIG. 20 is an ion beam sputtering (IBS) apparatus.

The IBS apparatus is controlled by a deposition controller 103. In the IBS apparatus, a raw material for thin films is arranged on a target 207 of a main unit 100, is heated by the energy caused by bombardment of ion beams emitted from an ion gun 102, and is vaporized. Thin-films are made using molecules of plasmas of this raw material and thus exhibit a high density. Moreover, since deposition is performed in a high vacuum, the amount of contaminant is small, and high-quality thin films can be deposited at a high accuracy.

In this IBS apparatus, a multilayer thin-film having a designed thickness is deposited while controlling the thickness of each layer deposited on the substrate using a thickness monitor 101 for measuring the thickness of the layers deposited in the main unit 100. The thickness monitor 101 is either of a type that measures the thickness using a natural frequency of a crystal oscillator, i.e., a crystal thickness meter, hereinafter referred to as the "crystal monitor", or of a type that measures the transmittance or the reflectance of the thin-film formed on a substrate, i.e., a thickness sensor, hereinafter referred to as the "optical monitor".

However, the crystal monitor and the optical monitor described above have the following drawbacks when they are used in making a multilayer thin-film requiring a high accuracy.

The crystal monitor has a high resolution in measuring changes in thickness d of the deposited layers and can accurately control the relative thickness of the deposited layer. However, a measurement error regarding the absolute thickness occurs as the thickness of a thin-film formed on the crystal oscillator changes. Thus, the detected thickness d is different from the actual thickness, which is a problem.

Moreover, since the crystal monitor indirectly measures the optical thickness, i.e., the mechanical thickness, without considering variation in the refractive index, the crystal monitor cannot respond to the changes in the optical thickness. This is because some layers have the same mechanical thickness but different refractive indices depending on the characteristics of the layers.

In contrast, the optical monitor can directly measure the optical thickness, i.e., $dp=n \cdot d$, that takes into account changes in refractive index n. The optical monitor uses a measuring light having a wavelength $\lambda$, a quarter of which is equal to the optical thickness dp of each layer, and processes this measuring light to determine changes in transmittance or the like over time, as shown in FIG. 21.

The deposition controller 103 detects that a thin-film having a required thickness dp is formed when the changes in the transmittance reach the extrema, such as at a time $t_1$ or a time $t_2$. The deposition controller 103 then stops the operation of the ion gun 102 and ends deposition of thin-films in the main unit 100.

However, when a film having a small optical thickness dp ($=\lambda/4$) is deposited, the measuring light sometimes cannot be set at a suitable wavelength.

Referring now to FIG. 21, if a layer having a thickness corresponding to the thickness formed at the time $t_3$ at a wavelength $\lambda_3$ is to be formed, i.e., the optical thickness that does not correspond to $\lambda_3/4$, the output from the optical monitor (the thickness monitor 101) does not show the extremum of transmittance at the time $t_3$.

In contrast, extrema of the transmittance can be observed at the times $t_1$, $t_2$ and $t_4$, when the optical layers having thicknesses of $\lambda_1/4$, $\lambda_2/4$, and $\lambda_4/4$, respectively, are formed.

FIG. 21 shows the relationship between time and the transmittance data DT output from the optical monitor. The graph in FIG. 21 shows that an optical thin film having a thickness dp of $\lambda_1/4$ is formed at the time $t_1$, an optical thin film having a thickness dp of $\lambda_2/4$ is formed at the time $t_2$, and an optical thin film having a thickness dp of $\lambda_4/4$ is formed at the time $t_4$.

Here, $\lambda_1$, $\lambda_2$, $\lambda_3$ and $\lambda_4$ each represent wavelengths of the measuring light.

Accordingly, in the conventional deposition apparatus, the designated optical thickness must be detected without using extrema, if the optical layer to be deposited has a thickness not suitable to be measured by an optical monitor, resulting in a larger variation, which is a problem.

SUMMARY OF THE INVENTION

An object of the present invention is to provide a method for forming optical thin films and an apparatus therefor that achieve highly accurate deposition control in which the crystal monitor and the optical monitor function to complement the drawbacks of each other.

In order to achieve this object, a first aspect of the present invention provides an apparatus for forming an optical thin film including: a thin-film forming unit for forming a thin film by depositing a substance on a surface of a substrate; an optical monitor for optically measuring the thickness of the thin film and outputting first thickness data; a crystal monitor for measuring the thickness of the thin film based on a crystal frequency and outputting second thickness data; and a thickness determining unit for controlling deposition by the thin-film forming unit based on one of the first thickness data and the second thickness data by switching the optical monitor and the crystal monitor. The thickness of the deposited film is normally measured with the optical monitor. However, when the thickness of the layer cannot be measured by the optical monitor because the thickness is excessively small or is not suited to be measured by the optical monitor, the crystal monitor is used instead of the optical monitor. Here, the thickness data of the crystal monitor is corrected by the coefficient calculated based on the thickness data of the optical monitor measured up to the point of switching from the optical monitor to the crystal monitor. In this manner, a multilayer thin film constituted from layers having various thicknesses can be formed.

Preferably, the thickness determining unit controls the deposition based on the first thickness data when the thickness of the thin film to be deposited is measurable with the optical monitor, and the thickness determining unit controls the deposition based on the second thickness data when the thickness of the thin film to be deposited is not measurable with the optical monitor. The thicknesses of the layers constituting the multilayer thin film are designed to form a suitable filter, and the designed thickness of each layer is input to the apparatus in advance. Accordingly, when a layer having a thickness not suitable to be measured with the optical monitor is formed, the crystal monitor is used from the beginning of the deposition instead of the optical monitor to control the thickness. Thus, in making multilayer thin film constituted from layers having various thicknesses, the ion gun can be stopped without delay, the thickness of each layer can be accurately controlled, and the deposited layers have designed thicknesses.

Preferably, the thickness determining unit corrects the second thickness data based on the first thickness data. The crystal monitor exhibit a high resolution in measuring the thickness; however, as a substance is deposited on a crystal oscillator, i.e., a thickness sensor, the second thickness data of the crystal monitor deviates from the actual value, i.e., the first thickness data, which is a problem. In order to overcome this problem, the second thickness data of the crystal monitor is corrected every time the deposition of one of the layers is completed so that the crystal monitor always has the thickness data as same as that of the optical monitor. In this manner, the thickness of the layer can be measured at a high accuracy. When a layer having a thickness which is not measurable with the optical monitor, the thickness of the layer can be accurately measured with the crystal monitor as with the optical monitor. Moreover, a multilayer thin film constituted from layers having various thicknesses can be formed.

Preferably, the thickness determining unit calculates the function of transmittance or reflectance from the first thickness data and estimates the time when the first thickness data output from the optical monitor coincides with a designed thickness data by multinomial regression over the calculated function. An example of the multinomial regression is a quadratic regression function. Since an extremum of change in transmittance can be detected before the extremum is actually reached, the endpoint of the deposition can be preliminarily set, and the ion gun can be stopped at the endpoint, i.e., the time when the extremum is reached, without delay. Thus, the layers having accurate designed thicknesses can be formed.

Preferably, the thickness determining unit calculates the function of transmittance or reflectance from the first thickness data and estimates the time when the first thickness data output from the optical monitor coincides with a designed thickness data according to changes in slope data obtained from regression calculation over the calculated function. Since an extremum of change in transmittance can be detected before the extremum is actually reached, the endpoint of the deposition can be preliminarily set, and the ion gun can be stopped at the endpoint, i.e., the time when the extremum is reached, without delay. Thus, the layers having accurate designed thicknesses can be formed.

Another aspect of the present invention provides a method for forming an optical thin film comprising: a thin-film forming step of forming a thin film by depositing a substance on a surface of a substrate; an optical monitoring step of optically measuring the thickness of the thin film so as to obtain first thickness data; a crystal monitoring step of measuring the thickness of the thin film based on a crystal frequency so as to obtain second thickness data; and a thickness determining step of controlling the deposition during the thin-film forming step based on one of the first thickness data and the second thickness data. The thickness of the deposited film is normally measured with the optical monitor. However, when the thickness of the layer cannot be measured by the optical monitor because the thickness is excessively small or is not suited to be measured by the optical monitor, the crystal monitor is used instead of the optical monitor. In this manner, a multilayer thin film constituted from layers having various thicknesses can be formed.

Preferably, the first thickness data is used when the thickness of the thin film to be deposited is measurable with an optical monitor, and the second thickness data is used when the thickness of the thin film to be deposited is not measurable with the optical monitor. The thicknesses of the layers constituting the multilayer thin film are designed to form a suitable filter, and the designed thickness of each layer is input to the apparatus in advance. Accordingly, when a layer having a thickness not suitable to be measured with the optical monitor is formed, the crystal monitor is used from the beginning of the deposition instead of the optical monitor to control the thickness. Thus, in making multilayer thin film constituted from layers having various thicknesses, the ion gun can be stopped without delay, the thickness of each layer can be accurately controlled, and the deposited layers have designed thicknesses.

A third aspect of the present invention provides an optical filter including a plurality of thin films made with the apparatus described above and by the method described above. In the optical filter, each layer accurately has a designed thickness even when the thicknesses of the layers differ irregularly from layer to layer. The optical filter has optimum characteristics as an optical thin film, such as a gain flattening filter (GFF), for accurately adjusting gains according to the frequency.

A fourth aspect of the present invention provides an apparatus for forming an optical thin film, including: thin-film forming unit for forming a thin film by depositing a substance on a surface of a substrate; an optical monitor for optically measuring the thickness of the thin film and outputting first thickness data, e.g., a transmittance data DT; a crystal monitor for measuring the thickness of the thin film based on a crystal frequency and outputting second thickness data, e.g., a frequency data DF; and thickness determining unit for controlling the deposition of the thin-film forming unit, wherein the thickness determining unit corrects the second thickness data by using the first thickness data and controls the deposition of the depositing unit based on the corrected second thickness data. According to this structure, the optical monitor is used to calculate the time when a thickness smaller than the designed value is reached, and then the crystal monitor having a high thickness measuring resolution is used to measure the thickness and determine the time when the deposited layer reaches the designed thickness. In this manner, the endpoint of deposition can be accurately determined. When a thin film having a designed thickness not suitable to be measured by the optical monitor is to be deposited, the crystal monitor having the thickness data corrected by the coefficient based on the thickness data of the optical monitor is used to measure the thickness from the beginning of the deposition. Accordingly, a multilayer thin film constituted from layers having thicknesses differing irregularly from layer to layer can be formed.

Preferably, the thickness determining unit has a first preset data of the first thickness data and a second preset data of the second thickness data used in determining the thickness, wherein the first present data is smaller than the second preset data. In other words, the first preset data to which the first thickness data is compared is smaller than the designed thickness for each layer of the filter, for example. After the first preset data has been reached, the deposition is controlled by the second data. That is, the endpoint of deposition is determined based on the measured values of the crystal monitor instead of the optical monitor. According to this structure, the measurement using the crystal monitor is performed after the extremum is estimated by approximation at a high accuracy so as to allow the crystal monitor to measure the thickness, i.e., to detect the endpoint of the deposition, at a high resolution even when the layers of the multilayer thin film have various thicknesses and various characteristics due to various refractive indices. As a result, the thickness of the deposited layer can be controlled at a high accuracy without delay, the ion gun can be stopped without delay, and a multilayer thin film constituted from layers having designed thicknesses can be obtained.

Preferably, the thickness determining unit calculates the function of transmittance or reflectance from the first thickness data and estimates the time when the first thickness data output from the optical monitor coincides with a designed thickness data by multinomial regression, such as a quadratic regression, over the calculated function. Since an extremum of change in transmittance can be detected before the extremum is actually reached, the endpoint of the deposition can be preliminarily set, and the ion gun can be stopped at the estimated endpoint, i.e., the time when the extremum is reached, without delay. Thus, the layers having accurate designed thicknesses can be formed.

Preferably, the thickness determining unit calculates the function of transmittance or reflectance from the first thickness data and estimates the time when the first thickness data output from the optical monitor coincides with a designed thickness data according to changes in slope data obtained from regression calculation over the calculated function. Since an extremum of change in transmittance can be detected before the extremum is actually reached, the endpoint of the deposition can be preliminarily set, and the ion gun can be stopped at the estimated endpoint, i.e., the time when the extremum is reached, without delay. Thus, the layers having accurate designed thicknesses can be formed.

Whereas the conventional method for forming an optical thin film measures the thickness of the deposited layer with only one of the optical monitor and the crystal monitor, a method of the present invention according to a fifth aspect includes: a thin-film forming step of depositing a material on a surface of a substrate to form a thin film; an optical monitoring step of optically measuring the thickness of the thin film so as to obtain first thickness data; a crystal monitoring step of measuring the thickness of the thin film based on a frequency so as to obtain second thickness data; and a thickness determining step of controlling the deposition during the thin-film forming step, in which the second thickness data is corrected by the first thickness data, and the deposition during the thin-film forming step is controlled based on the corrected second thickness data. According to this structure, the optical monitor is used to calculate the time when a thickness smaller than the designed value is reached, and then the crystal monitor having a high thickness measuring resolution is used to measure the thickness and determine the time when the deposited layer reaches the designed thickness. In this manner, the endpoint of deposition can be accurately determined. When a thin film having a designed thickness not suitable to be measured by the optical monitor is to be deposited, the crystal monitor having the thickness data corrected by the coefficient based on the thickness data of the optical monitor is used to measure the thickness from the beginning of the deposition. Accordingly, a multilayer thin film constituted from layers having thicknesses differing irregularly from layer to layer can be formed.

Preferably, during the thickness determining step above, a first preset data of the first thickness data for determining the thickness is smaller than a second preset data of the second thickness data. In other words, the first preset data to which the first thickness data is compared is smaller than the designed thickness for each layer of the filter, for example. After the first preset data has been reached, the deposition is controlled by the second data. That is, the endpoint of deposition is determined based on the measured values of the crystal monitor instead of the optical monitor. According to this structure, the measurement using the crystal monitor is performed after the extremum is estimated by approximation at a high accuracy so as to allow the crystal monitor to measure the thickness, i.e., to detect the endpoint of the deposition, at a high resolution even when the layers of the multilayer thin film have various thicknesses and various characteristics due to various refractive indices. As a result, the thickness of the deposited layer can be controlled at a high accuracy without delay, the ion gun can be stopped without delay, and a multilayer thin film constituted from layers having designed thicknesses can be obtained.

Another aspect of the present invention provides an optical filter including a plurality of thin films made with the apparatus described above and by the method described above. In the optical filter, each layer accurately has a designed thickness even when the thicknesses of the layers differ irregularly from layer to layer. The optical filter has optimum characteristics as an optical thin film, such as a gain flattening filters for accurately adjusting gains according to the frequency.

DESCRIPTION OF THE PREFERRED EMBODIMENTS

Figure 1:
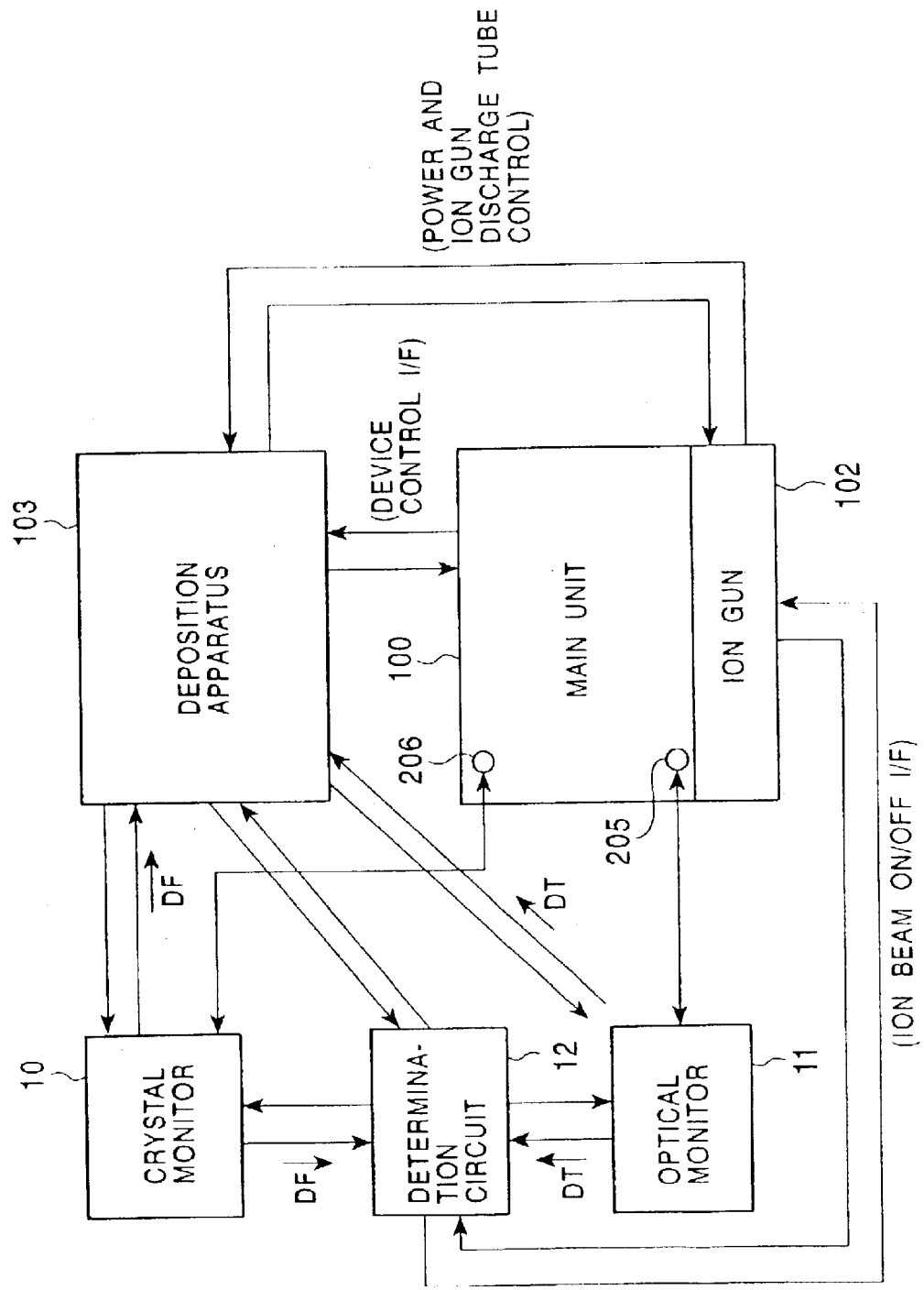
FIG. 1 is a block diagram showing an exemplary structure of a deposition apparatus according to a first embodiment of the present invention.
Figure 20:
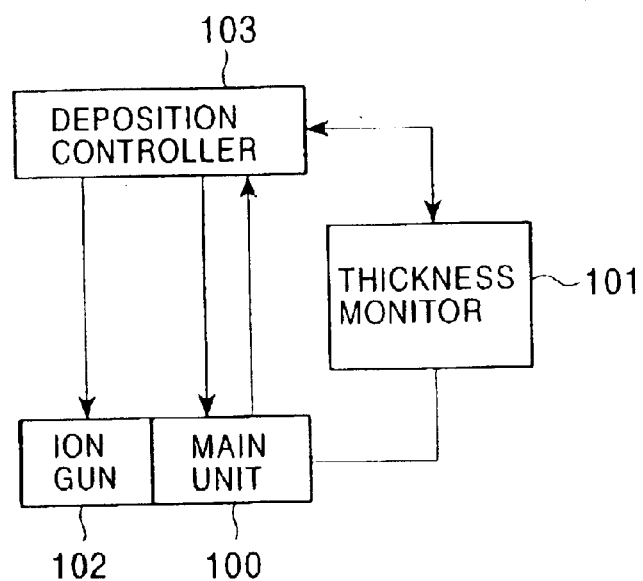
FIG. 20 is a block diagram showing the structure of a conventional deposition apparatus.
Figure 21:
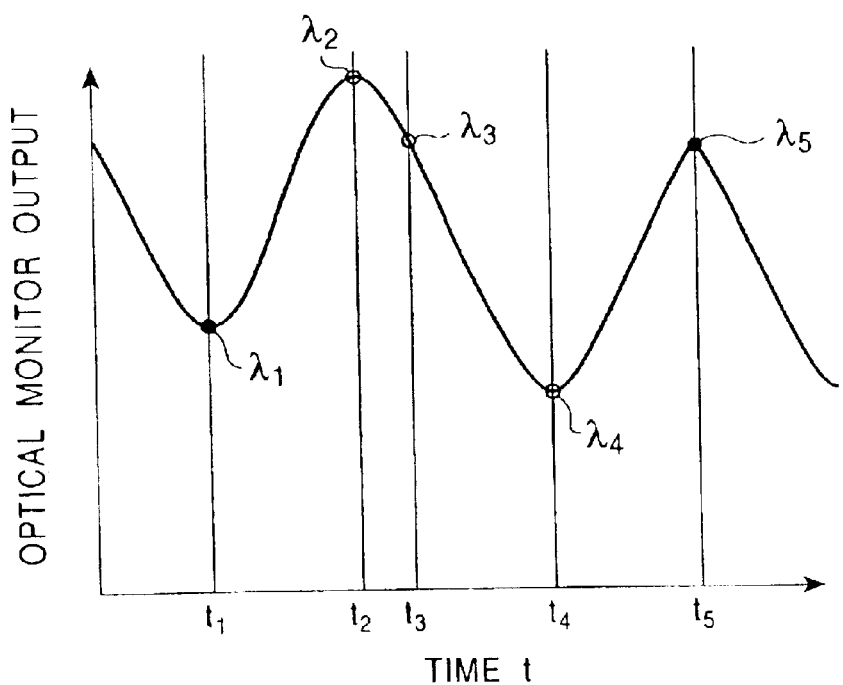
FIG. 21 is a graph showing the relationship between the deposition time of the optical thin film and the transmittance.

A first embodiment of the present invention will now be described with reference to the drawings. FIG. 1 is a block diagram showing the configuration of a deposition apparatus according to a first embodiment of the present invention. The components common to those of the conventional deposition apparatus shown in FIG. 20 are represented by the same reference characters and the descriptions thereof are omitted.

Referring to FIG. 1, a frequency signal, i.e., crystal oscillator natural frequency information, from a thickness sensor 206 (see FIG. 2) comprising a crystal oscillator installed inside a vacuum chamber 3 of a main unit 100 is input to a crystal monitor 10. The crystal monitor 10 converts the frequency signal to digital data and outputs the resulting digital frequency data DT indicating the natural frequency of the crystal oscillator to a deposition controller 103 and a determination circuit 12.

Figure 2:
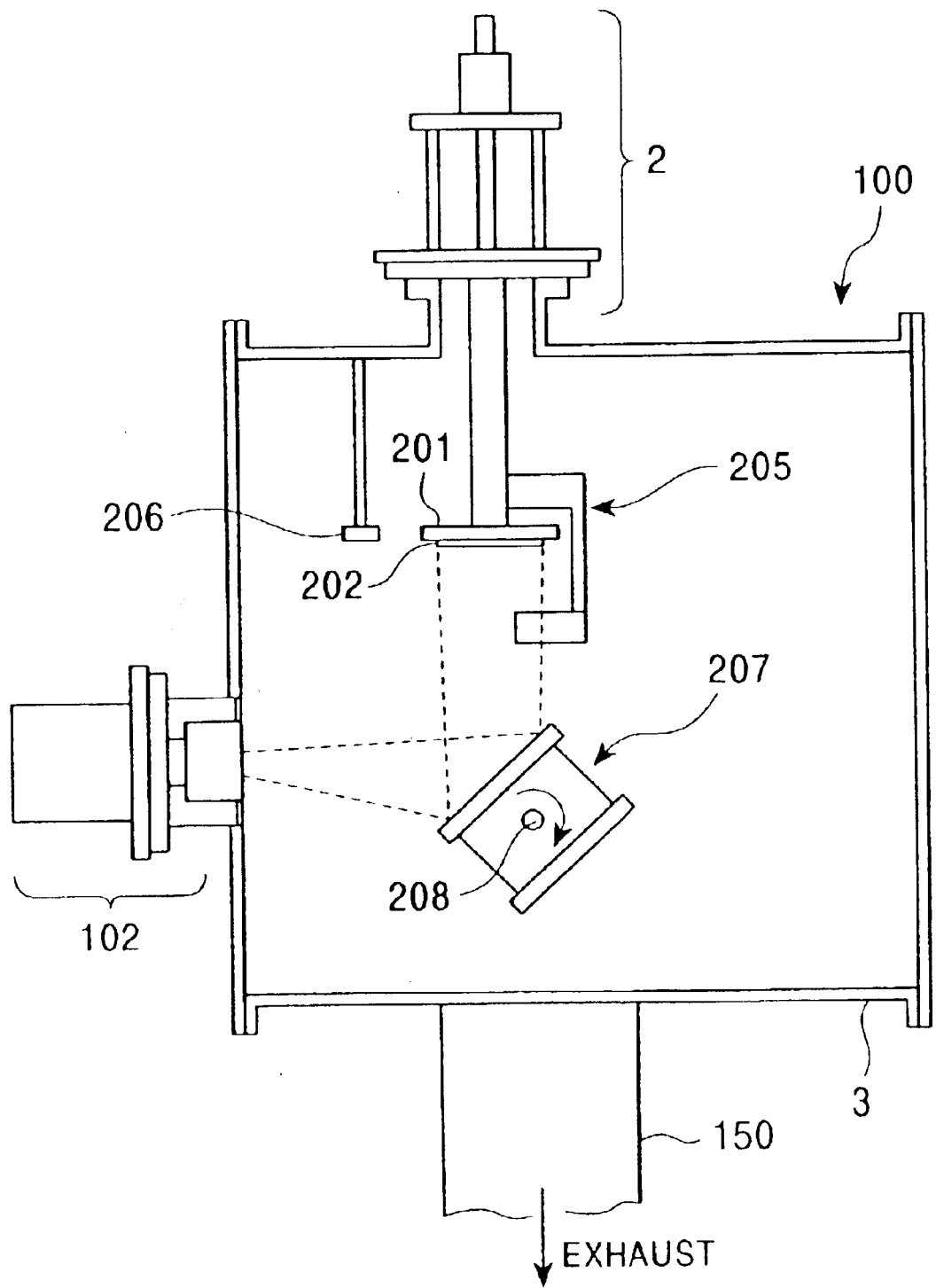
FIG. 2 is a conceptual diagram showing an exemplary structure of a deposition main unit 100 and a ion gun 102 shown in FIG. 1.

FIG. 2 shows the detailed configurations of the main unit 100 and an ion gun 102. A substrate 202, onto which a multilayer film is to be deposited, is fixed to a substrate holder 201 connected to a rotary unit 2. The rotary unit 2 is constituted from a motor and the like and rotates the substrate holder 201 so that the atoms and molecules from the target 207 are uniformly deposited onto the substrate 202.

The ion gun 102 accelerates the generated ions, and the resulting ion beams bombard the deposition material of the target 207. The material on the target then bombards the substrate 202 using the energy of the ion beams.

The target 207 is rotatable around a shaft 208. A plurality of materials can be deposited onto the substrate 202 by directing specific faces of the target 207, each carrying a specific material for deposition, toward the ion beams from the ion gun 102.

The degree of vacuum of the vacuum chamber 3 is adjusted by evacuating air or gas, i.e., raw material that was emitted from the target 207 but was not deposited on the substrate, inside the vacuum chamber 3 from an exhaust 150 using a vacuum pump (not shown in the drawing).

Figure 3:
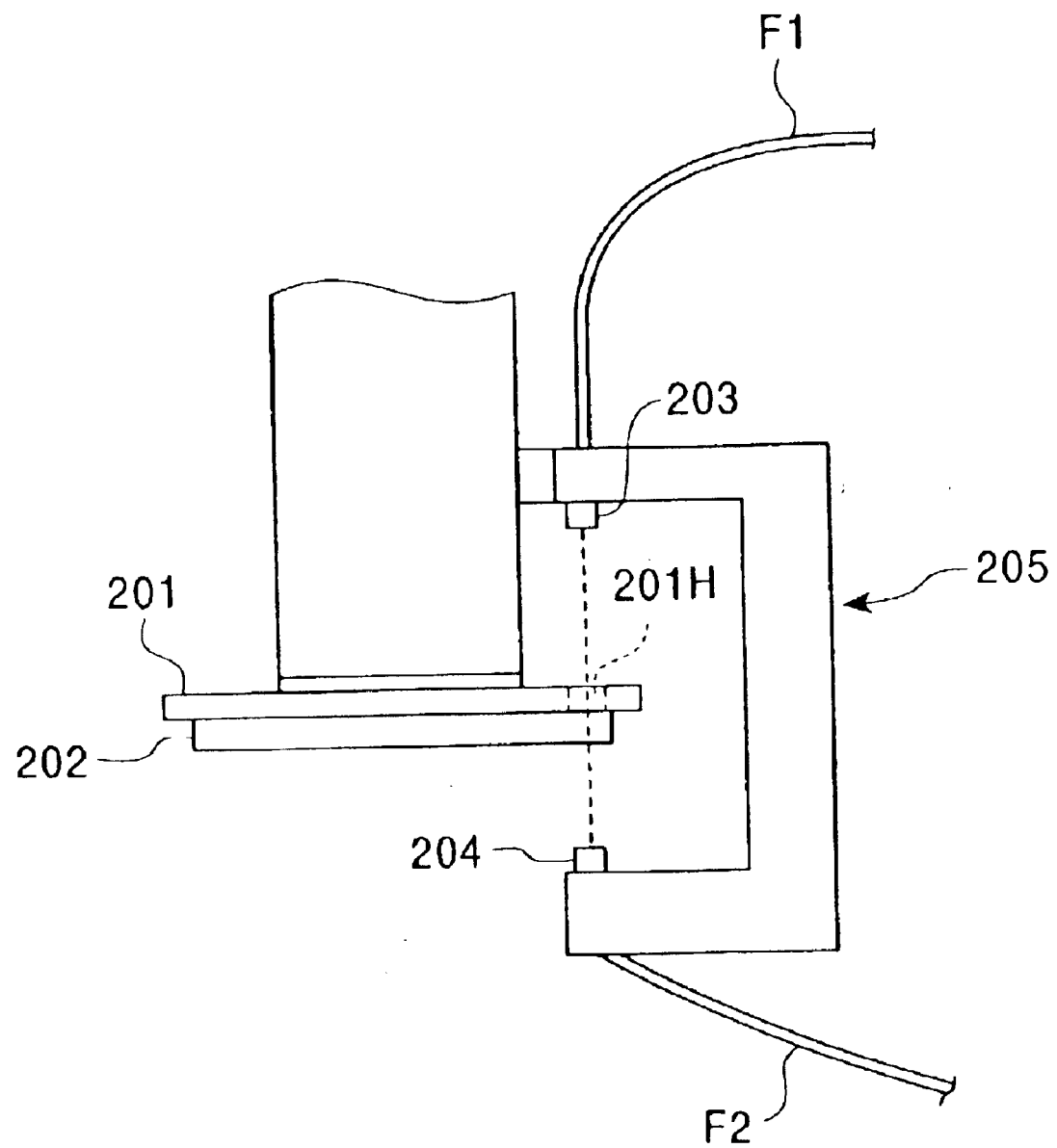
FIG. 3 is a conceptual diagram showing an exemplary structure of an optical monitor sensor 205 shown in FIG. 2.

FIG. 3 shows the detailed structure of an optical monitor sensor 205 of an optical thickness measuring system of this embodiment. The optical monitor sensor 205 includes a light projector 203 installed in the vacuum chamber 3 (see FIG. 2). The light projector 203 emits a measuring light having a predetermined wavelength, which is delivered via an optical fiber F1. The emitted light passes through a window 201H, which is a hole formed in the substrate holder 201, and reaches the back surface of the substrate 202. The wavelength of the measuring light is adjusted to be four times larger than the thickness dp of a target layer, i.e., $\lambda/4$ corresponds to the thickness dp of the target layer.

The optical monitor sensor 205 also includes a light receiver 204 including a condenser lens and so on. The light transmitted through the substrate 202 is received by the light receiver 204 and is output to an optical monitor 11 via an optical fiber F2.

Referring back to FIG. 1, the transmitted light is input to the optical monitor 11 delivered from the light receptor 204 (see FIG. 3) of the optical monitor sensor 205 formed inside the vacuum chamber 3, and the optical monitor 11 then generates a detection signal having a voltage corresponding to the intensity of the transmitted light received.

The optical monitor 11 performs A/D conversion of the detection signal, calculates digital transmittance data DT from the ratio of the intensity of the detection signal received to that when no thin-film is yet to be formed, and outputs the digital transmittance data DT to the determination circuit 12 and the deposition controller 103.

The deposition controller 103 determines whether the crystal monitor 10 and the optical monitor 11 are operating normally based on the frequency data DF input from the crystal monitor 10 and the transmittance data DT input from the optical monitor 11.

The deposition controller 103 controls the power necessary for discharging in the ion gun 102 and controls the degree of vacuum inside the vacuum chamber 3.

The crystal monitor 10 converts the frequency signal input from the thickness sensor 206 comprising the crystal oscillator to digital data, i.e., the frequency data DF, at predetermined intervals and outputs the frequency data DF to the determination circuit 12.

The determination circuit 12 allows the ion gun 102 to start ion beam emission under the control of the deposition controller 103, determines whether the thin-film being deposited has reached a designed thickness based on the transmittance data DT and the frequency data DF input thereto, and then stops the ion beam emission from the ion gun 102 toward the target.

Subsequently, the determination circuit 12 corrects the thickness d determined based on the frequency data DF input from the crystal monitor 10. The correction is performed based on the thickness dp determined from the transmittance data DT of the optical monitor 11.

Figure 4:
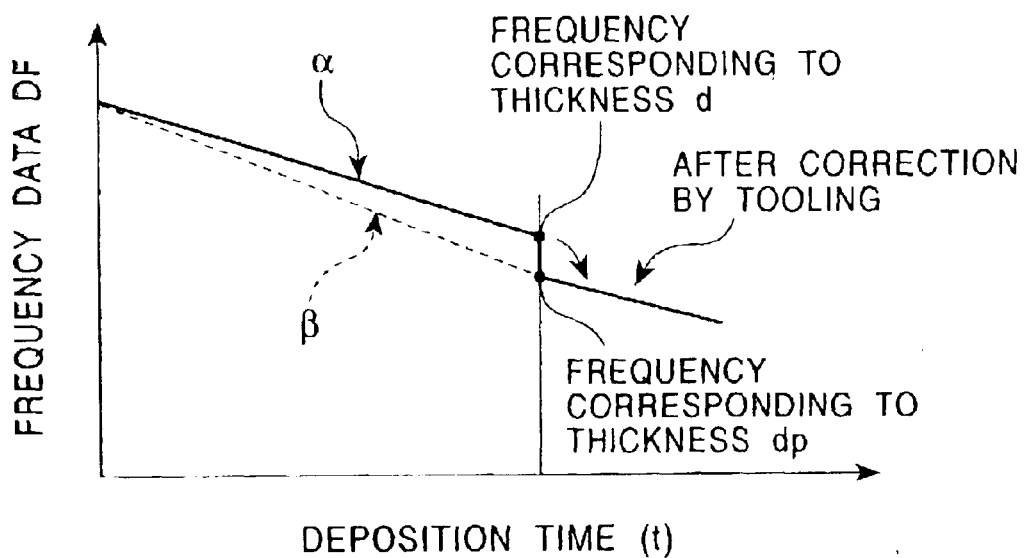
FIG. 4 is a graph showing the relationship between a frequency signal input from the sensor 205 to a crystal monitor 10 and deposition time.

That is, as shown in FIG. 4, the determination circuit 12 corrects the thickness d calculated from the frequency data DF input from the crystal monitor 10 so that the thickness d becomes coincident with a thickness dt calculated from the thickness dp determined based on the transmittance data DT.

FIG. 4 is a graph showing the relationship between deposition time and the frequency indicated by the frequency data DF. The frequency indicated by the frequency data DF is the oscillation frequency (natural frequency or crystal frequency) of the crystal oscillator of the thickness sensor 206 and depends on the thickness d. As shown in FIG. 4, the oscillation frequency decreases as deposition progresses, i.e., as the substance is deposited on the crystal oscillator which constitutes the thickness sensor 206.

In FIG. 4, the horizontal axis indicates the deposition time, and the vertical axis indicates the frequency of the frequency data DF. The solid line α shows the actually measured values. The line α is the frequency data DF that includes errors generated during transmission of the data from the crystal monitor 10 to the determination circuit 12. The dotted line β in FIG. 4 shows the original values which are the error-free frequency data DF calculated based on the transmittance data DT.

In short, the thickness d is based on the frequency data DF, and the thickness dt is the thickness corrected based on the transmittance data DT.

The determination circuit 12 compares the thickness d calculated from the frequency data DF to the thickness dt calculated from the transmittance data DT. Based on this comparison, the thickness d is corrected to the value of the thickness dt so that the thickness d calculated from the frequency data DF is the same as the thickness dt calculated from the thickness dp determined by the transmittance data DT.

According to the above-described arrangement, the thickness d calculated from the frequency data DF is always about the same as the corrected thickness dt without having errors accumulated in the thickness d.

Here, as shown in FIG. 4, the determination circuit 12 calculates the correction coefficient which makes the line a coincide with the dotted line β when the measured values are multiplied thereby, while correcting the frequency data DF to allow the thickness d to be the same as the thickness dt, i.e., equivalent to the optical thickness dp.

In this manner, the time at which the designed thickness is reached can be estimated based on the function representing the frequency data DF and time, i.e., based on the dotted line β corrected by the above-described correction coefficient, at an accuracy comparable to that in the detection of the designed thickness using the optical monitor 11.

During deposition, the determination circuit 12 calculates the deposition rate, i.e., the rate of increase in the thickness d in a predetermined period of time, each time the deposition of one layer is completed. The deposition rate is updated as needed.

In this manner, the determination circuit 12 can accurately calculate the estimated time required for a layer having a thickness d at the beginning of deposition to reach the designed thickness based on the function represented by the dotted line β shown in FIG. 4, i.e., based on the frequency data DF and the correction coefficient described above.

The thickness d is corrected to the actual thickness as follows. The determination circuit 12 divides the thickness dp calculated from the transmittance data DT by the refractive index n to convert the thickness dp into the mechanical thickness dt. The thickness dt is then set as the thickness d calculated based on the crystal monitor 10.

The determination circuit 12 performs a correction to constantly make the optical thickness, i.e., the product of the thickness d and the refraction index n, equal to the thickness dp calculated from the transmittance data DT. At the same time, the determination circuit 12 corrects the growth rate of the layer, i.e., an increase in the thickness per unit time. The deposition rate is corrected by multiplying a correction coefficient and the frequency data DF, i.e., correcting the amount of change in the thickness obtained from the function representing the relationship between the frequency (the thickness) and time based on the measured frequency (tooling compensation).

Before depositing the layers, a control signal from the deposition controller 103 indicating the designed thicknesses of the layers constituting a multilayer thin-film is input to the determination circuit 12. The determination circuit 12 then determines whether the thickness of a thin-film formed on the substrate 202 is measurable, and examines whether the optical monitor 11 is operating normally.

Even when the layers to be deposited are designed to have various thicknesses differing from layer to layer, the determination circuit 12 still estimates an extremum of the transmittance, i.e., the endpoint of deposition, based on the transmittance data DT obtained from the optical monitor 11, if the thickness of the layer to be formed is large enough to be measured with the optical monitor 11.

As described above, the optical monitor 11 cannot detect whether the thickness of the thin-film has reached its designed thickness when the thicknesses of the layers of the multilayer thin-film have no regularity, i.e., differ from layer to layer, or are extremely small, or when the optical monitor 11 is not operating properly.

Accordingly, when the layers to be formed have a thickness less than a predetermined thickness or when a control signal indicating abnormal operation of the optical monitor 11 is input to the determination circuit 12 from the deposition controller 103, the determination circuit 12 performs the following operations. The determination circuit 12 calculates the thickness d based on the corrected frequency data DF obtained from the crystal monitor 10, estimates the time when the mechanical thickness reaches the designed value based on the function represented by the dotted line β showing the relationship between the corrected frequency data DF (thickness) and time, as shown in FIG. 4, and stops ion beam emission from the ion gun 102 at the estimated time to complete the deposition process.

Since the determination circuit 12 stops deposition of thin-films at the estimated time, layers having accurate thicknesses can be deposited.

When the thickness of the layer is measurable with the optical monitor 11, i.e., when an extremum of the transmittance is detectable, the determination circuit 12 determines that the designed optical thickness has been reached by detecting the extremum of the transmittance data DT, as described above, and thus ends the operation.

However, even when ion beam emission is to be stopped at the point when an extremum is detected by the determination circuit 12, the deposition continues during the time required for detecting the extremum, thereby exceeding the designed thickness.

In order to overcome this problem, the determination circuit 12 processes the input transmittance data DT to estimate the time tp when the extremum is reached, and stops the ion gun at this estimated time tp so as to minimize the delay time between detection of the transmittance extremum and stopping the ion gun 102.

The time tp when the transmittance extremum of the thin-film is reached is estimated by two methods described below.

One of the two methods uses a quadratic regression function below to estimate the deposition time, i.e., the time tp when the extremum is reached.

The light receiver 204 converts the intensity of the transmitted light emerging from the substrate 202 and the deposited layer into a voltage corresponding to the intensity and outputs the converted signal as the detection signal.

Based on the detection signal, the determination circuit 12 reads the transmittance data DT, which is A/D converted and output by the optical monitor 11, as the value that indicates the intensity of the transmitted light.

Figure 5:
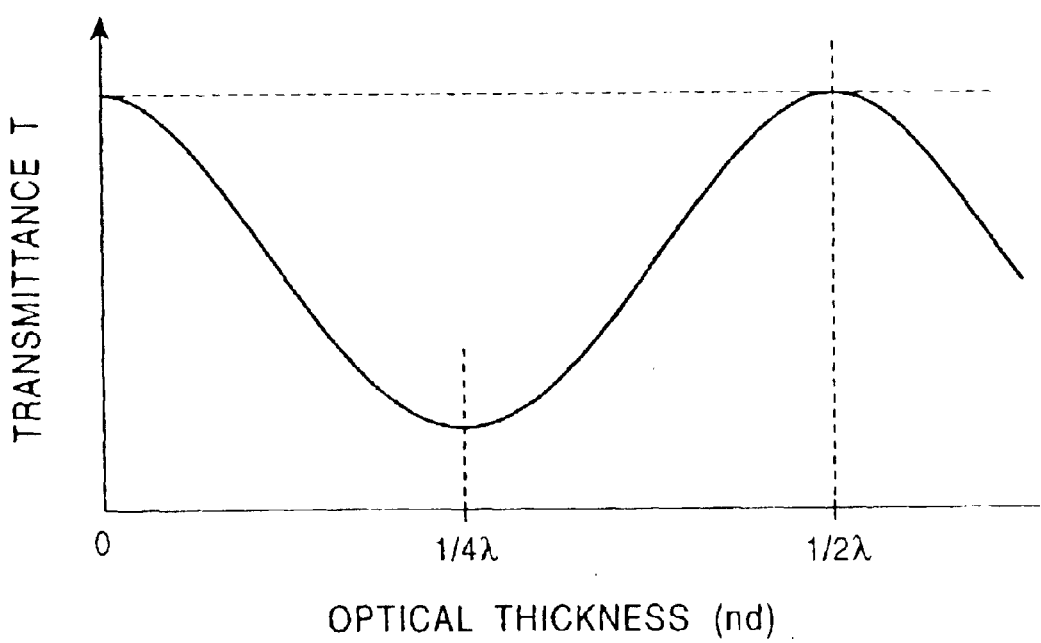
FIG. 5 is a graph showing the relationship between the thickness of an optical thin film to be deposited and the transmittance of the thin film.

As shown in FIG. 5, the transmittance data DT forms a periodic curve corresponding the wavelength λ of the measuring light and the transmittance based on the thickness dp of the deposited thin-film. In FIG. 5, the horizontal axis indicates the optical thickness, and the vertical axis indicates the transmittance.

Around the extremum of the transmittance, the curve can usually be approximated by polynomial expression (1) below. The approximation is possible even when the fourth order and higher terms are omitted:

$$y = a_0 + a_1 \cdot t + a_2 \cdot t^2 + a_3 \cdot t^4 + a_4 \cdot t^6 + \ldots \quad (1)$$

wherein $a_0$, $a_1$, $a_2$, $a_3$, and $a_4$ are regression coefficients.

The transmittance of the substrate 202 and the deposited thin-film requires a more complex function because of the complexity during the deposition of thin-films, nonuniformity of the refractive indices of the thin-films, and the linearity of electrical current amplification at the light receiver 204 and the optical monitor 11.

However, around the extremum, approximation by omitting the fourth order and higher terms of expression (1) is possible:

$$y = a_0 + a_1 \cdot t + a_2 \cdot t^2 \quad (2)$$

Figure 6:
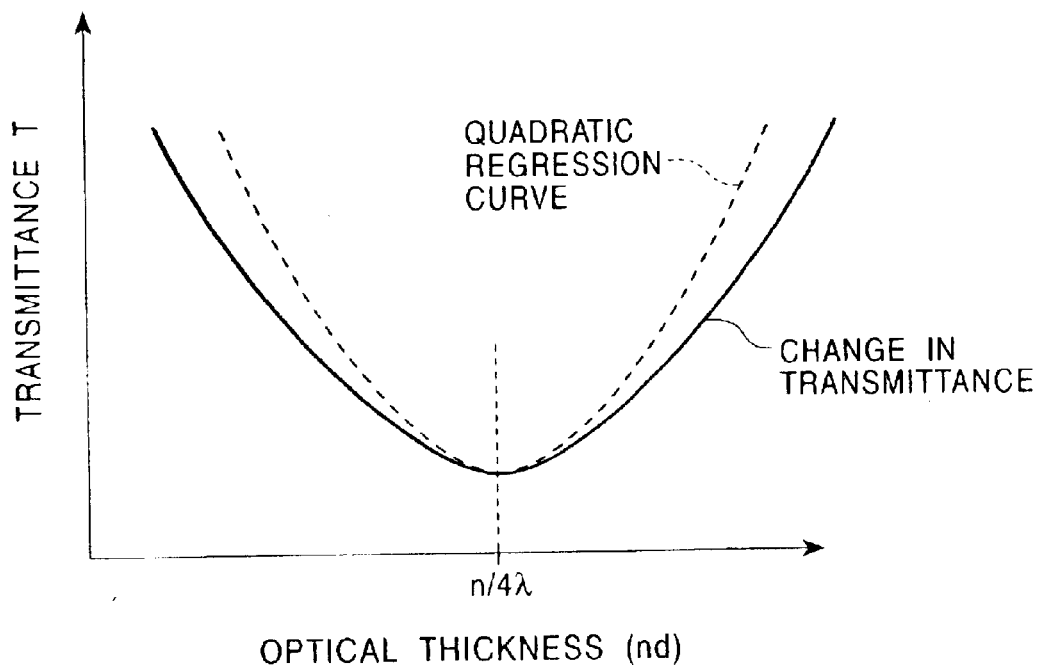
FIG. 6 is a graph showing the relationship between the deposition time of the optical thin film and the transmittance.

FIG. 6 is a graph showing a curve (solid line) of theoretical changes in transmittance derived from expression (1) above and a quadratic regression curve (dotted line) derived from expression (2), in which the horizontal axis indicates the optical thickness and the vertical axis indicates the transmittance. In contrast to expression (1), expression (2) is an approximation by a quadratic regression function, wherein $a_0$ to $a_2$ are coefficients.

Figure 7:
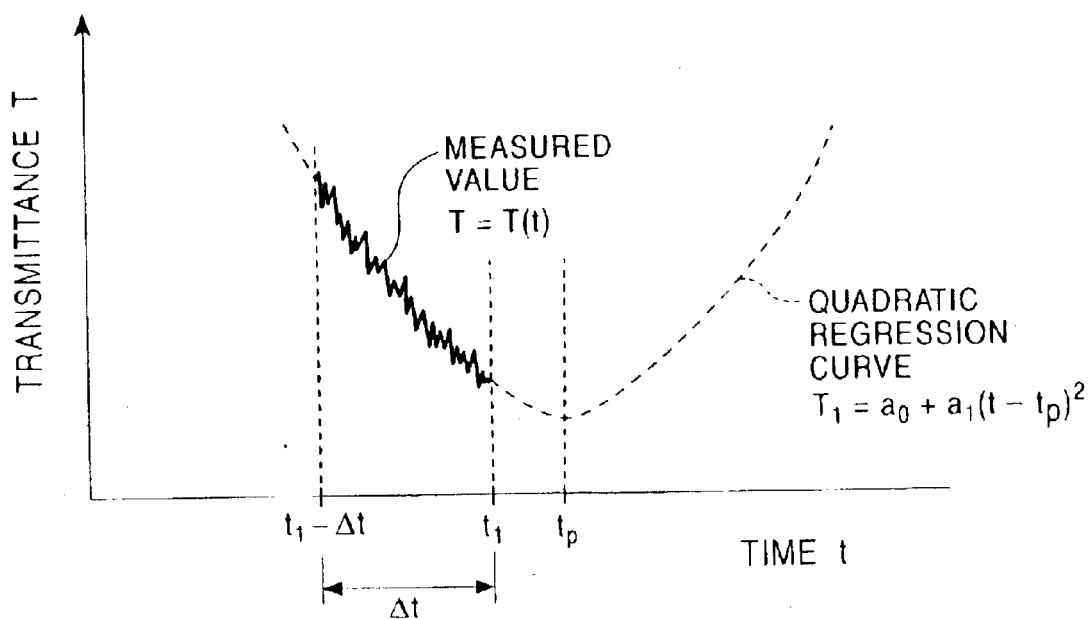
FIG. 7 is a graph showing the relationship between the deposition time of the optical thin film and the transmittance.

As shown in FIG. 7 (horizontal axis: time, vertical axis: transmittance), the input transmittance data DT contains noise since the actual transmittance T(t) of the sampled transmitted light contains superimposed noise. In FIG. 7, the quadratic curve is shown by a dotted curve.

The determination circuit 12 determines the differential value, i.e., the slope of a tangential line, of the quadratic regression expression (2) using expression (3):

$$dy/dt = a_1 + 2 \cdot a_2 \cdot t \quad (3)$$

The determination circuit 12 then calculates the time when the slope of the tangential line becomes zero so as to estimate the time tp when the extremum of the transmittance is reached for measuring light having a wavelength corresponding to the measured thickness of the thin-film.

In other words, the time tp is determined by $$tp = -a_1/(2 \cdot a_2).$$

The other method for estimating the deposition time, i.e., the time tp when an extremum is reached, by detecting the extremum of the transmittance calculates changes in the slope by the regression calculation described below.

Figure 8:
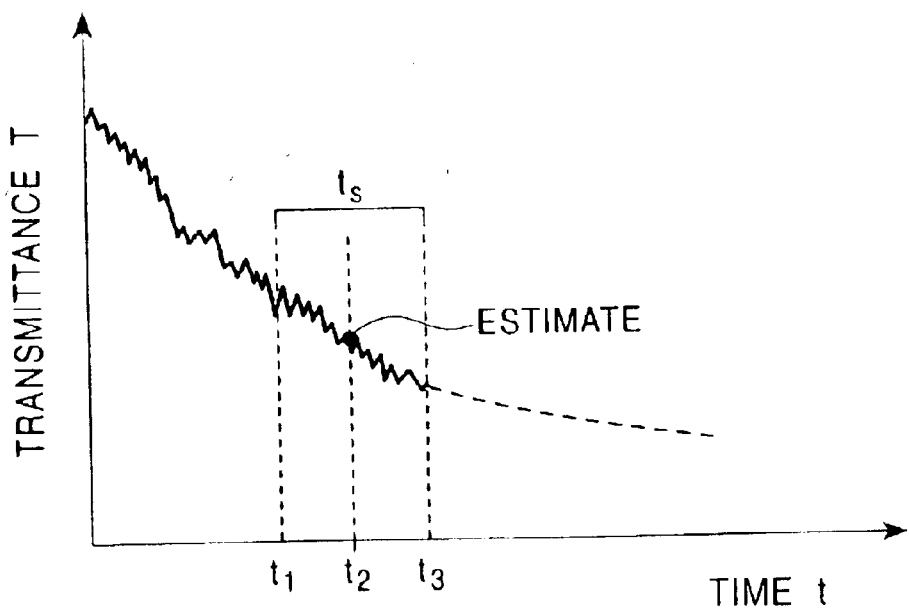
FIG. 8 is a graph showing the relationship between the deposition time of the optical thin film and the, transmittance.

FIG. 8 is a graph showing the transmittances $T_1$, $T_2$, and $T_3$ at times $t_1$, $t_2$, and $t_3$, respectively. In the graph, the horizontal axis indicates time and the vertical axis indicates the transmittance. The times $t_1$, $t_2$, and $t_3$ are set at a predetermined interval. As shown in FIG. 8, the transmittances $T_1$, $T_2$, and $T_3$ include superimposed noise.

The method uses regression calculation to estimate the time when the change in the slope of the transmittance becomes zero.

In particular, using a digital filter, high-frequency components are removed from the transmittance that includes the superimposed noise shown in FIG. 8. During the process, calculation using expression (4) below is performed at the digital filter:

$$y_n = \sum_{l=0}^{N-1} W_l X_{n-l} \quad (4)$$

wherein n and l are integers, and X is the input signal, i.e., the transmittance corresponding to the accompanying number.

Here, a Hanning window is used as the time window that determines the range of the filter calculation. The Hanning window used in expression (4) above is as follows:

$$W_l = \begin{cases} 0.5 - 0.5\cos\left(\dfrac{2\pi l}{N-1}\right) \\ 0 \end{cases} \quad (5)$$

where $0 \leq l \leq N-1$

The number of data items N (N: integer) corresponds to the averaging zone. For example, transmittances $T_i$, $T_{i+1}$, ..., $T_{i+N-1}$, measured at predetermined time intervals, are averaged.

The next averaging zone is for transmittances $T_{i+1}$, $T_{i+2}$, ..., $T_{i+N}$, also measured at a predetermined time interval.

Figure 9:
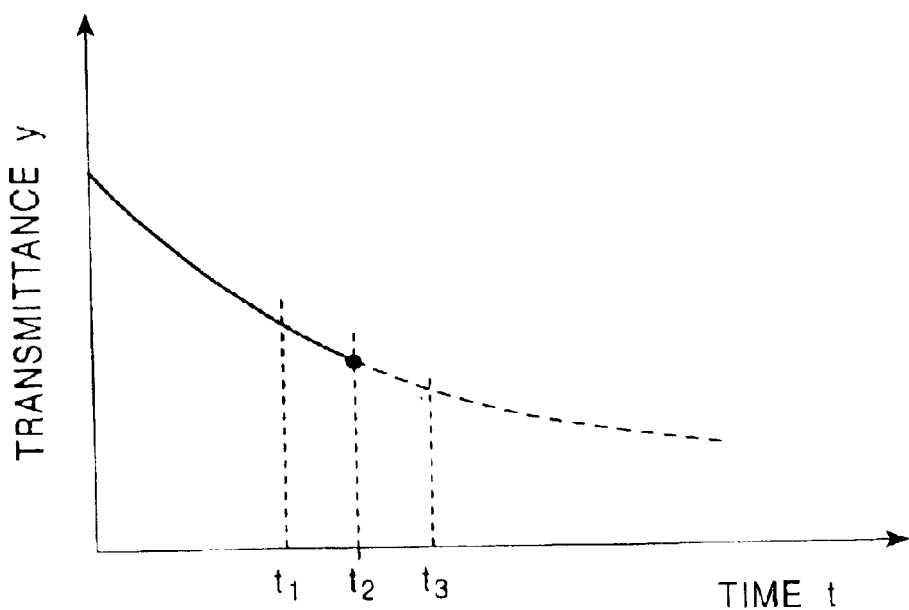
FIG. 9 is a graph showing the relationship between the deposition time of the optical thin film and the transmittance of the deposited film.

As shown in FIG. 9, when the filter calculation zone is the time range $t_s$ from the time $t_1$, to the time $t_3$ (corresponds to the range of $T_i$, $T_{i+1}$, ..., $T_{i+N-1}$ above), an averaged smooth curve from which the high-frequency components have been removed is output as a result of the filter calculation and as the transmittance at the time $t_2$ before the time $t_3$ although the last transmittance was measured at the time $t_3$. In the graph, the horizontal axis indicates time and the vertical axis indicates the transmittance.

Figure 10:
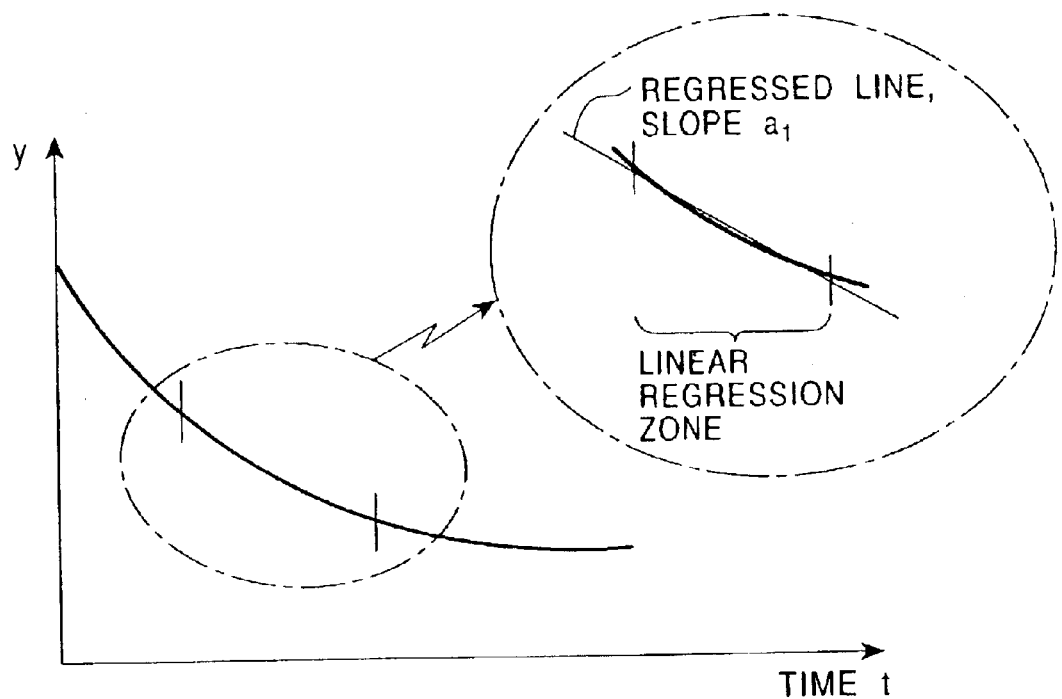
FIG. 10 is a graph showing the relationship between the deposition time of the optical thin film and the transmittance.

Next, based on the calculated transmittance described above, the determination circuit 12 performs, for example, a linear regression within a predetermined range, for example, the transmittance range $T_j$, $T_{j-1}$, ..., $T_{j+m-1}$, wherein j and m are natural numbers, as shown in FIG. 10. The average slope within the transmittance range (linear regression zone) of $T_j$, $T_{j-1}$, ..., $T_{j+m-1}$ is then determined.

As a result of the linear regression, the average slope of the transmittance within the above-described range is represented by expression (6):

$$y = a_0 + a_1 \cdot t \quad (6)$$

Figure 11:
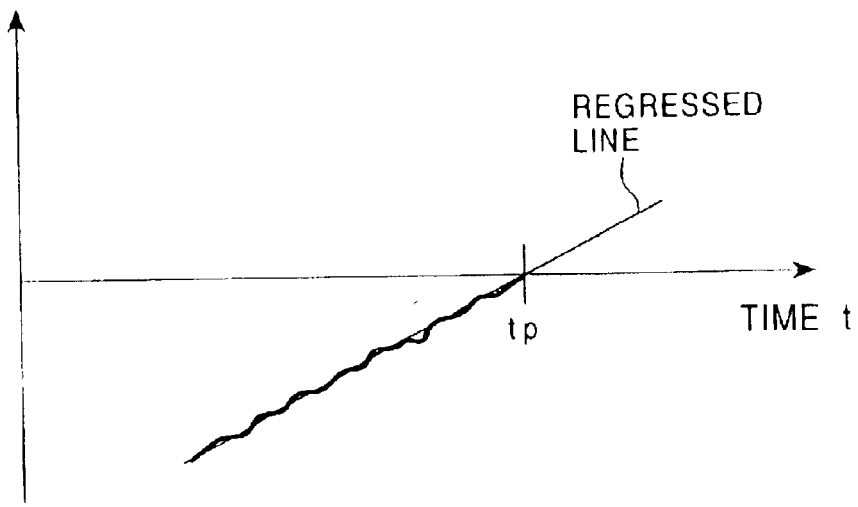
FIG. 11 is a graph showing the relationship between the deposition time of the optical thin film and the slope of the function of the transmittance.

Referring now to FIG. 11, the determination circuit 12 plots the average slopes determined from expression (6) above for every linear regression zone described above. In FIG. 11, the horizontal axis indicates time and the vertical axis indicates the slope of the transmittance. Based on the average slopes plotted, a linear regression is performed in a predetermined range to obtain expression (7):

$$a = b_0 + b_1 \cdot t \quad (7)$$

The time when the slope a becomes zero is calculated using expression (7) above. The result is output as the estimated value of the time tp at which the transmittance presumably reaches an extremum.

In other words, the estimated value $tp=-(b_0/b_1)$ is obtained from the formula $a=b_0+b_1 \cdot tp=0$.

If the radius of curvature of the transmittance change cannot be disregarded within the above-described regression zone, curvilinear regression using a polynomial expression of higher degrees can be performed to estimate the time tp at which the extremum is reached.

Figure 12:
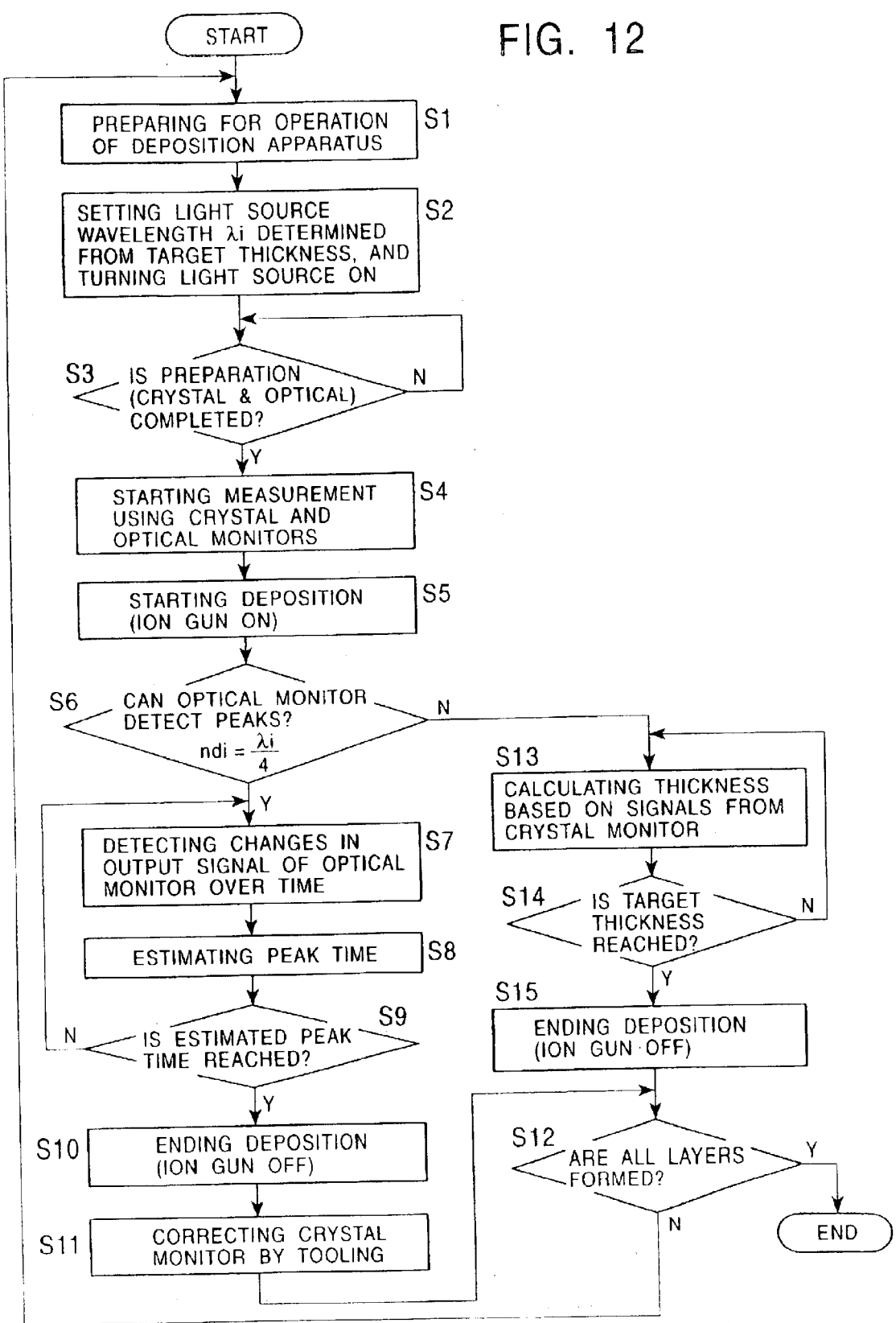
FIG. 12 is a flowchart for explaining an exemplary operation of the deposition apparatus of the first embodiment.

An exemplary operation according to the first embodiment will now be described with reference to FIGS. 1, 2, 3, and 12. FIG. 12 is a flowchart explaining the operation of the deposition apparatus 103 shown in FIG. 1.

Figure 13A:
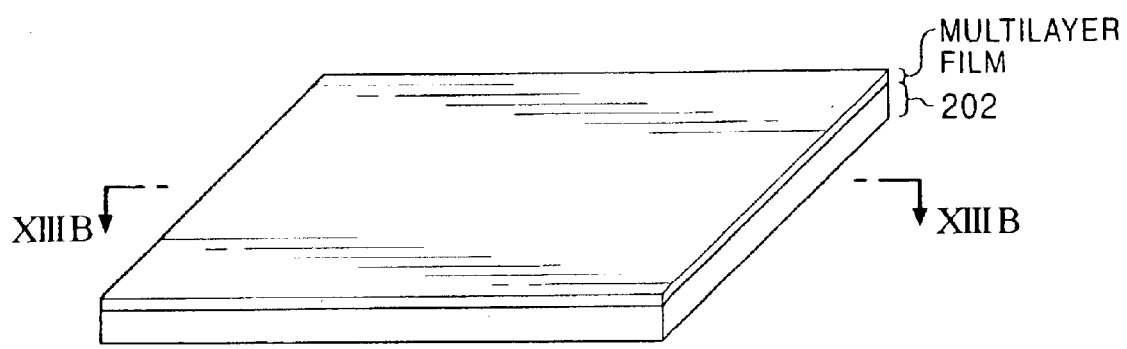
FIG. 13 is a conceptual diagram showing the structure of a multilayer thin film applied to a gain flattening filter (GFF)
Figure 13B:
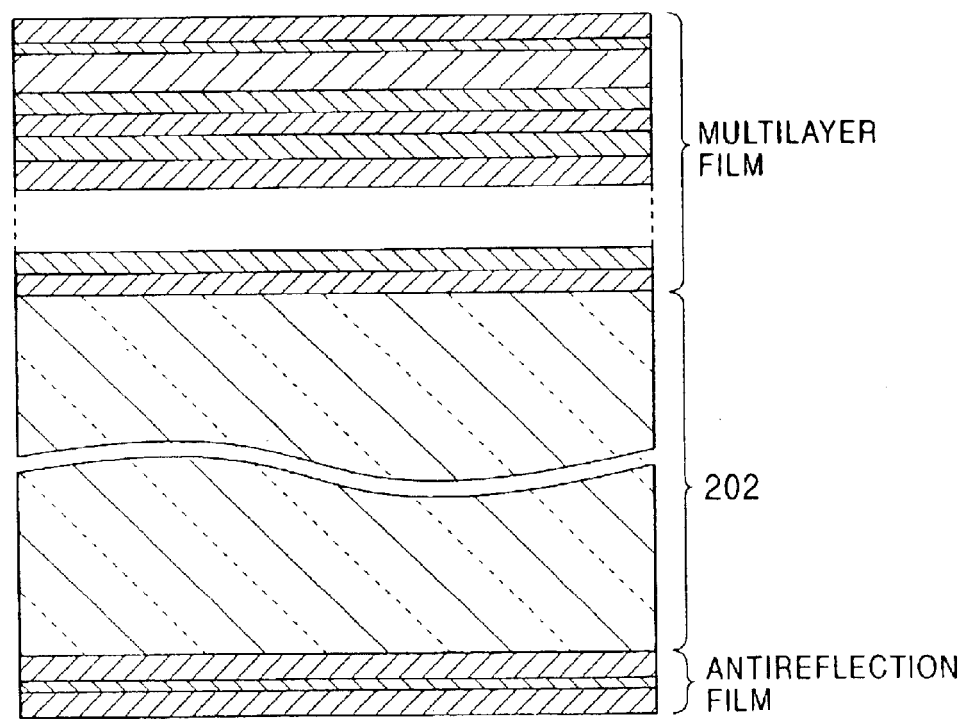

In this exemplary operation, a gain flattening filter (GFF) shown in FIGS. 13A and 13B is made by depositing a plurality of thin-films composed of different materials and having different thicknesses on the substrate 202 composed of glass (ceramic). The number of thin films to be deposited is several tens. FIG. 13A is a perspective view of the GFF, and FIG. 13B is a cross-sectional view taken along line XIIIB—XIIIB in FIG. 13A.

An antireflection film effective to light having a particular wavelength is formed on the rear surface of the substrate 202 after the multilayer thin-film is deposited at the upper surface of the substrate 202.

Referring now to FIG. 12, in step 1 (S1), an operator inputs data indicating the material for, and the thickness of, each layer of the multilayer film described above to the deposition controller 103 before operation of the deposition apparatus. For example, an optical thickness dp is input as the thickness data.

The material and the thickness of each layer are preliminarily designed and calculated to suit the characteristics required by a fiber amplifier. The data indicating designed material and calculated thickness of each layer are input to the deposition controller 103.

After the input, the operator starts deposition using the deposition apparatus.

Next, in step 2 (S2), in order to adjust the degree of vacuum in the main unit 100 to a predetermined level, the deposition controller 103 starts evacuation of the vacuum chamber 3 using a vacuum pump not shown in the drawing.

The deposition controller 103 calculates the wavelength λi corresponding to the designed thickness dp of the layer to be deposited, i.e., the wavelength λi quarter of which is the same as the thickness dp. The deposition controller 103 controls a light source (not shown) so as allow the light source to emit light having the wavelength λi toward the optical monitor sensor 205.

Next, in step 3 (S3), the deposition controller 103 determines whether the crystal monitor 10 and the optical monitor 11 are operating properly and whether the intensity and the wavelength of the measuring light output from the light source are stable. If the deposition controller 103 determines that any one of the intensity and the wavelength of the measuring light is not stable, the process of S3 is repeated until both are stable.

When the deposition controller 103 determines that the intensity and the wavelength of the measuring light output from the light source have become stable, step 4 (S4) begins.

In step 4, the deposition controller 103 controls the rotary unit 2 of the substrate holder to rotate at a predetermined speed and starts the operation of the crystal monitor 10 and the optical monitor 11. The deposition controller 103 commands the determination circuit 12 to start determination as to whether the designed thickness is reached, i.e., whether the estimated end time of deposition is reached, based on the frequency data DF from the crystal monitor 10 and the transmittance data DT from the optical monitor 11.

In step 5 (S5), a control signal indicating to start ion beam emission from the ion gun 102 to begin deposition is output from the deposition controller 103 to the determination circuit 12.

The determination circuit 12 controls the ion gun 102 to emit ion beams to the target 207 at an energy that achieves a predetermined deposition rate.

The deposition rate, which is the deposition amount per unit time, can be controlled by adjusting the ion energy.

Next, in step 6 (S6), the determination circuit 12 determines whether the thickness of the thin-film to be deposited is measurable, i.e., whether the extremum of the transmittance is measurable with the optical monitor 11. If measurable, step 7 (S7) begins.

In step 7, if the i-th layer of the multilayer is to be deposited, the determination circuit 12 controls the light source to emit a measuring light having a wavelength λi that satisfies the relationship $n \cdot di = \lambda i/4$. In this relationship, n is the refractive index of the thin film, and di is the mechanical thickness (thickness d) of a particular layer.

The determination circuit 12 plots the transmittance data DT for every predetermined time, i.e., the timing of the A/D conversion, in order to determine changes in the thickness of the layer that is being deposited. Here, the determination circuit 12 uses the transmittance data DT output from the optical monitor 11.

Next in step 8 (S8), the determination circuit 12 estimates the time tp when the transmittance extremum (peak) is reached based on the above described methods that use the transmittance data DT input from the optical monitor 11. The determination circuit 12 then stores the time tp as the preset time.

In step 9 (S9), the determination circuit 12 determines whether the estimated time tp at which the extremum is reached coincides with the present time.

When the time tp is not yet reached, steps 7 to 9 are repeated. When the time tp is reached, next step 10 (S10) begins.

In step 10, the determination circuit 12 commands the ion gun 102 to stop emitting ion beams and completes the deposition of the i-th layer.

Next, the determination circuit 12 performs tooling compensation to the crystal monitor 10 so as to correct the frequency corresponding to the thickness of the deposited layer and notifies the deposition controller 103 that the deposition is ended.

In next step 12 (S12), the deposition controller 103 determines whether all of the layers of the multilayer film are formed.

The deposition process ends if all layers are formed but starts again from S1 if all layers are not formed.

In step 6 (S6), the determination circuit 12 may determine that the thickness of the layer to be deposited is not measurable or that the thickness of the layer to be deposited cannot accurately determined by measuring the extremum of the curve of the transmittance data DT provided from the optical monitor 11. In such a case, step 13 (S13) begins after step 6.

In step 13 (S13), the determination circuit 12 determines whether the thickness of the thin film of i-th layer reached the designed mechanical thickness. This determination is based on the frequency data DF output from the crystal monitor 10.

In particular, the determination circuit 12 calculates the changes in the thickness d obtained from the frequency data DF of the crystal monitor 10 over time, calculates the additional time required for depositing layer up to a designed mechanical thickness based on this changes over time, and adds this additional time to the time at which the signal is detected (the time when the frequency data DF is input) to estimate the end time of the deposition. The process then proceeds to step 14 (S14).

In step 14, the determination circuit 12 determines whether the estimated end time determined in step 13 is reached. In other words, the determination circuit 12 determines whether the thickness of the layer has reached the designed thickness.

If the designed thickness is not reached, the determination circuit 12 commands steps 13 and 14 be repeated.

If the designed thickness is reached, the determination circuit 12 begins the step 15 (S15).

In step 15, the determination circuit 12 commands the ion gun 102 to stop emission of ion beams and completes the deposition of the i-th layer.

Next, the determination circuit 12 notifies the deposition controller 103 that the deposition is ended and begins step S12 where the deposition controller 103 determines whether all of the layers of the multilayer film are formed.

During step 12, the deposition controller 103 ends deposition if all layers are formed. If all layers are not formed, the deposition controller 103 starts the process from step 1 and begins deposition of the next layer, i.e., i+1-th layer, of the multilayer film.

Second Embodiment

A second embodiment of the present invention will now be described with reference to the drawings. Since FIGS. 1 to 3 are described in the first embodiment, the description therefor is omitted.

In this embodiment, the preset value of the determination circuit 12 for detecting the thickness of the deposited layer is smaller than the designed optical thickness.

Figure 18:
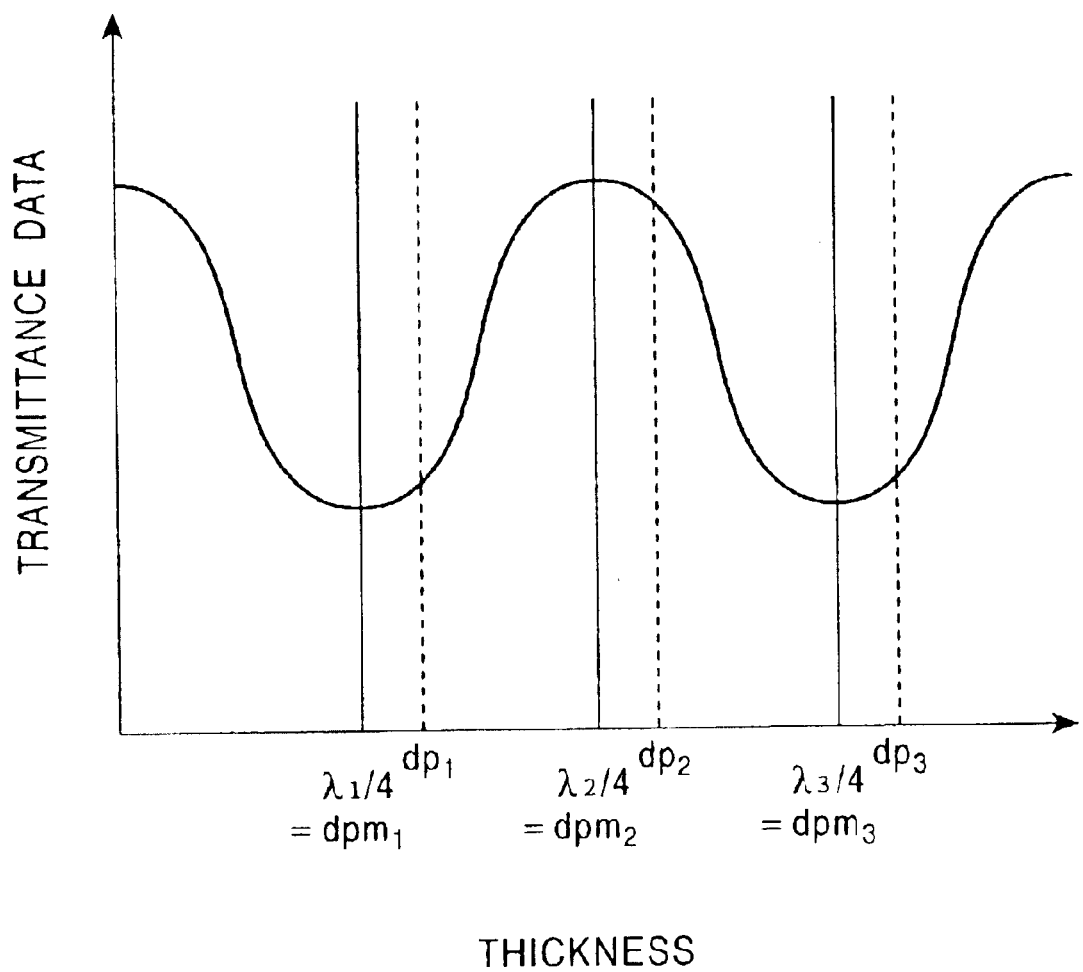
FIG. 18 is a graph showing the relationship between the thickness of the optical thin film and the transmittance data DT.

In particular, the preset thickness for the frequency data DF output from the crystal monitor 10 is set equal to the designed value, the end time of the deposition is detected based on the frequency data DF. As shown in FIG. 18, whereas the designed thicknesses to be detected by the frequency data DF are set at $dp_1$, $dp_2$, and $dp_3$, the preset thicknesses for the transmittance data DT are set at $dpm_1$, $dpm_2$, and $dpm_3$, respectively, which are smaller than $dp_1$, $dp_2$, and $dp_3$. The preset thicknesses $dpm_1$, $dpm_2$, and $dpm_3$, correspond to one quarter of the wavelengths λ at which extrema are detected.

In FIG. 18, the horizontal axis indicates the thickness, and the vertical axis indicates the transmittance data DT. The graph in FIG. 18 shows the function based on the measured transmittance data DT.

Herein, a light signal having a wavelength $\lambda_1$ quarter of which corresponds to $dpm_1$, a light signal having a wavelength $\lambda_2$ quarter of which corresponds to $dpm_2$, a light signal having a wavelength $\lambda_3$, quarter of which corresponds to $dpm_3$ are used.

When an extremum is reached based on the transmittance data DF, the determination circuit 12 corrects the relationship between the frequency data DF and the mechanical thickness d based on the thickness detected at the extremum. Using the corrected relationship between the frequency data DF and the mechanical thickness d, the optical monitor 11 detects the endpoint of the deposition.

The determination circuit 12 corrects the thickness d determined from the frequency data DF input from the crystal monitor 10 based on the thickness dp calculated from the transmittance data DT from the optical monitor 11. The method for correction is the same as that in the first embodiment.

As described above, in the determination circuit 12, the preset value in the optical monitor 11 for thickness detection is smaller than the designed thickness. After the thickness is detected at the optical monitor 11, the crystal monitor 10 is used to detect the designed thickness and to control deposition. When the estimated time is reached, the determination circuit 12 determines that the designed optical thickness is reached, and ends the deposition process.

The determination circuit 12 proceeds to the detection using the crystal monitor 10 after the extremum is reached. In such a case, because the detection of extremum using the optical monitor 11 takes time, a delay time is generated before the determination circuit 12 proceeds to the detection process using the crystal monitor 10. Since deposition continues during the delay time, the layer is deposited to a thickness exceeding the designed thickness.

To avoid this problem, the determination circuit 12 performs signal processing to the input transmittance data DT to estimate the time tp when the extremum is reached and proceeds to the detection using the crystal monitor 10 when this estimated time tp is reached. In this manner, the delay time from the detection of the transmittance extremum to starting of the thickness detection using the crystal monitor 10 can be reduced.

The details of the process for estimating the extremum of the transmittance of the deposited layer are the same as in the first embodiment.

Figure 19:
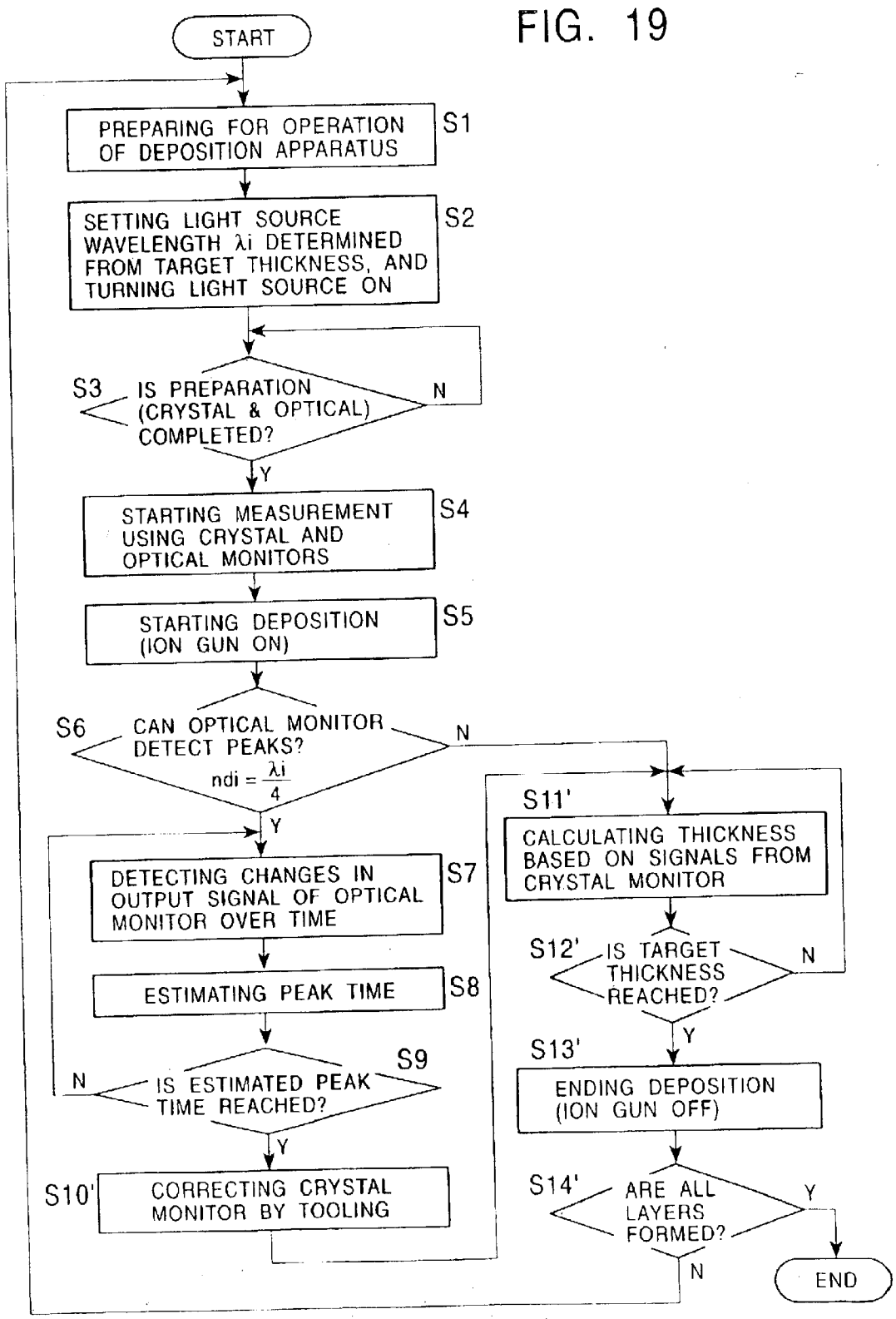
FIG. 19 is a flowchart for explaining an exemplary operation of a deposition apparatus according to a second embodiment of the present invention.

Next, an exemplary operation of the second embodiment is described with reference to FIGS. 1, 2, 3, and 19. FIG. 19 is a flowchart for explaining the operation of the deposition apparatus shown in FIG. 1.

In this exemplary operation, a gain flattening filter (GFF) shown in FIGS. 13A and 13B is made by depositing a plurality of thin-films composed of different materials and having different thicknesses on the substrate 202 composed of glass (ceramic). The number of thin films to be deposited is several tens. FIG. 13A is a perspective view of the GFF, and FIG. 13B is a cross-sectional view taken along line XIIIB—XIIIB in FIG. 13A.

An antireflection film effective to light having a particular wavelength is formed on the rear surface of the substrate 202 after the multilayer thin-film is deposited at the upper surface of the substrate 202.

Referring now to FIG. 19, in step 1 (S1), an operator inputs data indicating the material for, and the thickness of, each layer of the multilayer film described above to the deposition controller 103 before operation of the deposition apparatus. For example, an optical thickness dp is input as the thickness data.

The material and the thickness of each layer are preliminarily designed and calculated to suit the characteristics required by a fiber amplifier. The data indicating designed material and calculated thickness of each layer are input to the deposition controller 103.

After the input, the operator starts deposition of optical thin films using the deposition apparatus.

For the purpose of explanation, the deposition process of an i-th layer is explained. The designed thickness di (mechanical thickness) of, and the material for, the i-th layer is input.

In step 2 (S2), in order to adjust the degree of vacuum in the main unit 100 to a predetermined level, the deposition controller 103 starts evacuation of the vacuum chamber 3 using a vacuum pump (not shown in the drawing).

In depositing the i-th layer, the deposition controller 103 sets the preset thickness to a thickness dpm which is smaller than the target thickness (designed thickness) dp, i.e., the input designed thickness di. The deposition controller 103 calculates the wavelength $\lambda i$ corresponding to the preset thickness dpm, i.e., the wavelength $\lambda i$ quarter of which is the same as the thickness dpm, and adjusts the light source accordingly so that the measuring light having the wavelength $\lambda i$ is emitted from the light source.

Next, in step 3 (S3), the deposition controller 103 determines whether the crystal monitor 10 and the optical monitor 11 are operating properly and whether the intensity and the wavelength of the measuring light output from the light source are stable. If the deposition controller 103 determines that any one of the intensity and the wavelength of the measuring light is not stable, the process of S3 is repeated until both are stable.

When the deposition controller 103 determines that the intensity and the wavelength of the measuring light output from the light source have become stable, step 4 (S4) begins.

In step 4, the deposition controller 103 controls the rotary unit 2 of the substrate holder to rotate at a predetermined speed and starts the operation of the crystal monitor 10 and the optical monitor 11. The deposition controller 103 commands the determination circuit 12 to start determination as to whether the designed thickness is reached, i.e., whether the estimated end time of deposition is reached, based on the frequency data DF from the crystal monitor 10 and the transmittance data DT from the optical monitor 11. In other words, the determination circuit 12 starts the determination process as to whether the preset thickness dpm is reached in step 4.

Next, in step 5 (S5), a control signal indicating to start ion beam emission from the ion gun 102 to begin deposition is output from the deposition controller 103 to the determination circuit 12.

The determination circuit 12 controls the ion gun 102 to emit ion beams to the target 207 at an energy that achieves a predetermined deposition rate.

The deposition rate, which is the deposition amount per unit time, can be controlled by adjusting the ion energy.

Next in step 6 (S6), the determination circuit 12 determines whether the thickness of the thin-film to be deposited is measurable, i.e., whether the extremum of the transmittance is measurable with the optical monitor 11. If measurable, step 7 (S7) begins.

In step 7, since the i-th layer is being deposited, the determination circuit 12 controls the light source so as to allow the light source to emit a measuring light having the wavelength $\lambda i$ that satisfies the relationship $dmp = \lambda i/4$.

The determination circuit 12 plots the transmittance data DT for every predetermined time, i.e., the timing of the A/D conversion, in order to determine the change in thickness of the layer that is being deposited. Here, the determination circuit 12 uses the transmittance data DT output from the optical monitor 11.

Next in step 8 (S8), the determination circuit 12 estimates the time tp when the transmittance extremum (peak) is reached based on the above described methods that use the transmittance data DT input from the optical monitor 11. The determination circuit 12 then stores the time tp as the preset time.

In step 9 (S9), the determination circuit 12 determines whether the estimated time tp at which the extremum is reached coincides with the present time.

When the time tp is not yet reached, steps 7 to 9 are repeated. When the time tp is reached, i.e., when the thickness of the deposited film reaches the preset thickness dpm, next step 10' (S10') begins.

In step 10' (S10'), the determination circuit 12 converts the thickness dpm determined from the transmittance data DT to the mechanical thickness dt and performs tooling compensation on the crystal monitor 10 to correct the relationship between the frequency data DF and the thickness d so that the thickness d at this time is coincident with the thickness dt. The determination circuit 12 then proceeds to step 11' (S11').

Next, in step S11', the determination circuit 12 uses crystal monitor 10 instead of the optical monitor 11 to measure the thickness. The determination circuit 12 determines whether the deposited i-th layer the preset mechanical thickness di (preset optical thickness dp) based on the frequency data DF.

In other words, the determination circuit 12 calculates the changes in thickness d over time obtained from the frequency data DF of the crystal monitor 10, calculates the remaining time needed to deposit a layer having the preset mechanical thickness based on this changes overtime, and adds this remaining time to the time at which the signal was detected, i.e., the time at which the frequency data DF for calculating changes over time was input. The determination circuit 12 then estimates the time to end the deposition, and proceeds to step 12' (S12').

In step 12', the determination circuit 12 determines whether the calculated thickness di reached the designed thickness dp, i.e., whether the thickness reached the designed value.

If the designed thickness is not reached, the steps 11' and 12' are repeated.

If the designed thickness is reached, the determination circuit 12 proceeds to step S13'.

In step 13', the determination circuit 12 stops the ion beam emission from the ion gun 102 and ends the deposition of the i-th layer.

Next, in step 14' (S14'), the deposition controller 103 determines whether all of the layers constituting the GFF (multilayer thin film) are deposited based on the design data of the GFF input by the operator.

Here, the deposition controller 103 ends the deposition process when all of the layers of the multilayer film are formed. Otherwise, the deposition controller 103 goes back to step 1 (S1) and begins the deposition of the next layer, i.e., an n+1-th layer of the multilayer thin film.

In step 6 (S6), the determination circuit 12 may determine that the thickness of the layer to be deposited is not measurable or that the thickness of the layer to be deposited cannot be accurately determined by measuring the extremum of the curve of the transmittance data DT provided from the optical monitor 11. In such a case, step 11' (S11') begins after step 6.

The determination circuit 12 then performs steps 11' to 13' described above so as to measure the thickness of the layer based on the frequency data DF output from the crystal monitor 10 and to control the deposition process accordingly.

In step 11', when the optical monitor 11 cannot measure the thickness or control deposition due to the thickness of the thin film to be deposited or device failure and when the crystal monitor 10 cannot measure the thickness or control deposition due to the failure in the thickness sensor 206, the deposition controller 103 controls the process according to the time required for the thin-film deposition.

In other words, every time the tooling ratio is corrected, the determination circuit 12 assumes that the deposition time is at a constant level, and calculates the thickness of the deposited layer per unit time, i.e., the deposition rate, by dividing the thickness of the deposited layer by the time required for deposition. The determination circuit 12 then updates the deposition rate.

Accordingly, the determination circuit 12 calculates and estimated the time at which the deposition is completed according to the above-described deposition rate when neither optical monitor 11 nor crystal monitor 10 can be used to control the deposition.

In step 12', the determination circuit 12 determines whether the estimated time calculated as in above has been reached, i.e., whether the designed thickness has been reached.

If the designed thickness has not been reached, the determination circuit 12 repeats the steps 11' and 12'. If the designed thickness has been reached, the determination circuit 12 proceeds to step 13. The subsequent steps are the same as those described above.

As described above, the deposition apparatus for making an optical thin film according to the present invention has both crystal monitor 10 and the optical monitor 11. The determination circuit 12 determines whether the designed thickness has been reached and, if yes, the ion beam emission from the ion gun 102 is stopped to complete the deposition of the thin film. The determination as to whether the designed thickness has been reached is normally done by using the optical monitor 11, but when the thickness cannot be measured with the optical monitor 11, the crystal monitor 10 is used instead of the optical monitor 11. The crystal monitor 10 can measure the thickness regardless of the thickness of the deposited film, and thus enables deposition of multilayer structure that includes optical thin films having various thicknesses.

In the deposition apparatus for making an optical thin film according to the present invention, when the thickness of the optical thin film to be formed is measurable with the optical monitor 11, the determination circuit 12 uses the transmittance data for detecting the thickness. When the thickness is not suitable to be measured with the optical monitor 11, the frequency data from the crystal monitor 10 is used to control the deposition. The designed thickness of each layer of the multilayer thin film is preliminarily input to the deposition controller 103. When a thin film having a thickness not suitable for measurement by the optical monitor 11 is to be formed, the thickness of the thin film is controlled based on the measured values at the crystal monitor 10 instead of the optical monitor 11 from the beginning of the deposition. Thus, even when a multilayer thin film constituted from layers having various thicknesses is formed, the deposition of each layer can be halted without delay, i.e., the ion gun can be stopped without delay. Thus, the thickness can be accurately controlled without delay, and a multilayer thin film constituted from layers having designed thicknesses can be formed.

In the deposition apparatus for making an optical thin film according to the present invention, the determination circuit 12 performs correction of the thickness data based on the frequency signal from the crystal monitor 10 by using the thickness data obtained from the transmittance. This is due to the following reason. Although the crystal monitor 10 can measure the thickness at a high resolution, a thin films is also deposited on the crystal oscillator which is a thickness sensor, and thus the thickness calculated from the frequency data DF of the crystal monitor 10 deviates from the actual thickness, i.e., the thickness calculated from the transmittance data DT (first thickness data), which is a problem. In order to overcome this problem, the frequency data DF (second thickness data) of the crystal monitor 10 is corrected after the deposition of each layer so that the thickness data from the crystal monitor 10 is substantially the same as that of the optical monitor 11, i.e., so that the thickness of the deposited layer can be accurately measured. In depositing a layer having a thickness not suitable to be measure by the optical monitor 11, the thickness of the deposited layer can still be measured as accurately as with the optical monitor 11, even though the crystal monitor 10 is used instead of the optical monitor 11. Moreover, the multilayer thin film constituted from layers having various thicknesses can be formed according to the designed thicknesses.

In the above description, the thickness detection using the optical monitor 11 has been described in terms of transmittance. Alternatively, reflectance can be used to measure the thickness of the deposited layer.

In the deposition apparatus for making an optical thin film of this invention, the determination circuit 12 is provided with both the crystal monitor 10 and the optical monitor 11. The detection of the thickness using the optical monitor 11, i.e., detection of the extremum of the transmittance, is performed while setting the detection thickness at a value less than the designed thickness. After the extremum is detected at the optical monitor 11, the crystal monitor 10 is used to further control the thickness of the deposited layer. Thus, the time when the extremum is reached can be accurately detected. Since the measurement using the optical monitor 11 is already started at this estimated time, the endpoint of deposition and the thickness of the layer can be detected at a high resolution. Since the time when the designed thickness is reached can be accurately detected, the ion beam emission from the ion gun 102 can be halted and the deposition of the thin film can be ended at a suitable time. Moreover, a multilayer thin film constituted from optical layers having various different thicknesses can be made, and each optical layer can have an accurate thickness.

In the deposition apparatus for making an optical thin film according to the present invention, when the thickness of the optical layer to be formed is measurable with the optical monitor 11, the determination circuit 12 uses the transmittance data. When the thickness of the optical layer to be formed is not measurable with the optical monitor 11, the determination circuit 12 uses the frequency data from the crystal monitor 10 to control the deposition. Since the thickness of each layer of the multilayer thin film is input to the deposition controller 103 as the designed value of a filter or the like, the deposition is controlled using the crystal monitor 10 instead of the optical monitor 11 from beginning when a layer having a thickness not suitable to be measured with the optical monitor 11 is to be deposited. IN this manner, the endpoint of deposition, i.e., the stopping of the ion gun 102, can be controlled without delay, and the thickness of the deposited layer can be controlled with a high accuracy. Thus, a multilayer thin film constituted form layers having designed thicknesses can be formed.

In the deposition apparatus for making an optical thin film according to the present invention, the determination circuit 12 corrects the relationship between the frequency data DF and the mechanical thickness d using a coefficient. This coefficient is used in correcting the thickness data obtained from the frequency signal of the crystal monitor 10 by using the thickness data dp obtained from the transmittance. The correction is performed every time deposition of one of the layers is completed. In this manner, the problem of deviation of the frequency data DF of the optical monitor 11 from the actual thickness (the thickness dp based on the transmittance data obtained from the optical monitor 11) due to the growth of a thin film on the crystal oscillator, i.e., the thickness sensor, can be overcome. The thickness data of the optical monitor 11 can always be made substantially the same as that of the optical monitor 11, i.e., the thickness of the deposited layer can be accurately performed using the crystal monitor 10. Accordingly, when the crystal monitor 10 is used instead of the optical monitor 11 during deposition of a layer having a thickness not suitable to be measured by the optical monitor 11, the thickness of the deposited layer can be measured as accurately as with the optical monitor 11. Thus, a multilayer thin film constituted from layers having various thicknesses can be formed according to their designed thicknesses.

Moreover, in the deposition apparatus for making an optical thin film of the present invention, the determination circuit 12 can measure the thickness of the optical layer during deposition by time management based on the deposition rate. Thus, even when both the crystal monitor 10 and the optical monitor 11 are not in operation due to sudden failure or the like, the thickness of the deposited layer can be measured as accurately as with the optical monitor 11 and the crystal monitor 10 by using the deposition rate which is suitably updated. Thus, a multilayer thin film constituted from layers having various thicknesses can be formed according to their designed thicknesses.

Note that even though the optical monitor 11 utilizes the transmittance of the measuring light in the above embodiments, the optical monitor 11 may alternatively utilize the reflectance of the measured light.

An optical device incorporating the multilayer thin film made by the deposition method using the deposition apparatus of the present invention described above will now be explained.

Figure 14:
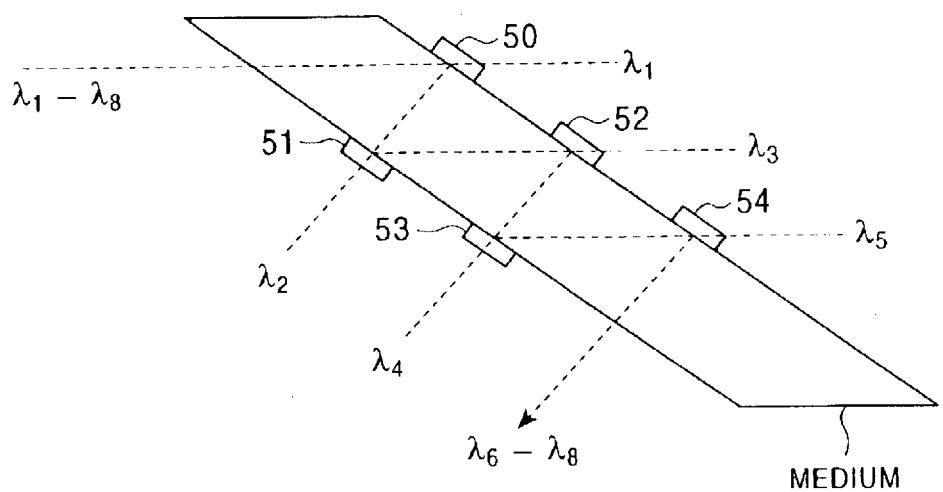
FIG. 14 is a conceptual diagram showing an exemplary structure of a band pass filter, i.e., an optical device, incorporating the present invention.

FIG. 14 is a cross-sectional view of an optical band pass filter (BPF) unit comprising optical filters that use the multilayer thin films of the present invention.

The optical BPF shown in FIG. 14 is constituted from a medium and a multilayer thin film optical BPFs 50, 51, 52, 53, and 54 attached to the medium.

For example, an optical signal having wavelengths of $\lambda_1$ to $\lambda_8$ is input to the filter shown in FIG. 14. The optical signal is divided into optical signals having wavelength of $\lambda_1$, $\lambda_2$, $\lambda_3$, $\lambda_4$, and $\lambda_5$ by the BPFs 50, 51, 52, 53, and 54, respectively, and output.

Accordingly, the band pass filter unit shown in FIG. 14 divides an input optical signal having a plurality of wavelength into optical signals each having a particular wavelength.

Figure 15:
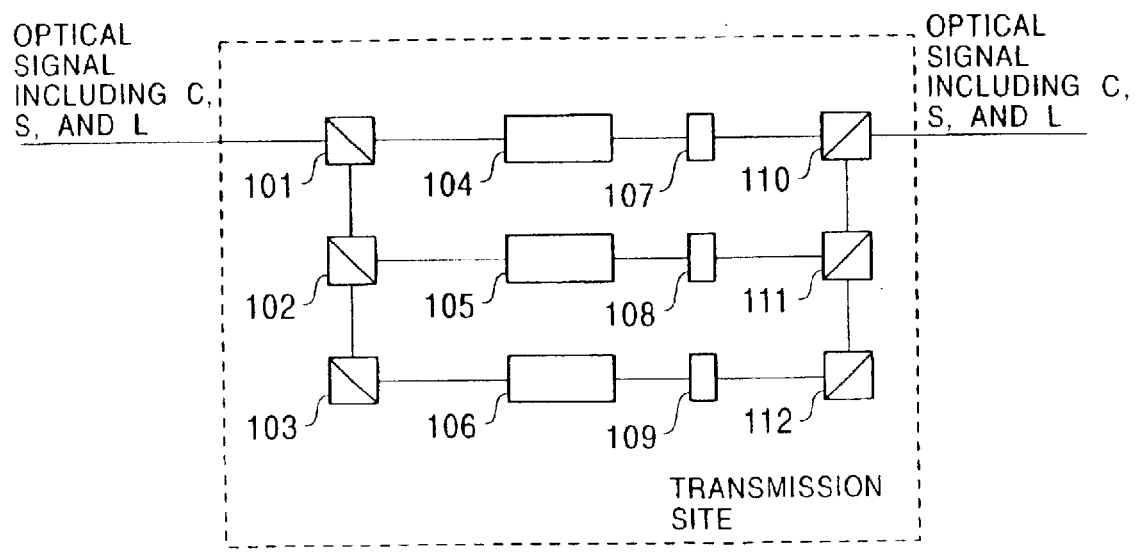
FIG. 15 is a conceptual diagram showing an optical communication transmission site having Z filters and GFFs.

FIG. 15 is a schematic illustration showing optical filters, namely, Z filters (edge filters) and BPFs, which are used in a transmission site that amplifies the attenuated intensity of the transmitted optical signals in optical communication.

Here, each of Z filters 101 to 102 has the reflectance of a particular wavelength adjusted and controls the transmission of the optical signal having the wavelength.

For example, the Z filter 101 exhibits a high reflectance over the wavelengths in the C-band and the L-band allows only the S-band optical signal to pass through and to enter an S-band fiber amplifier 104.

Figure 16:
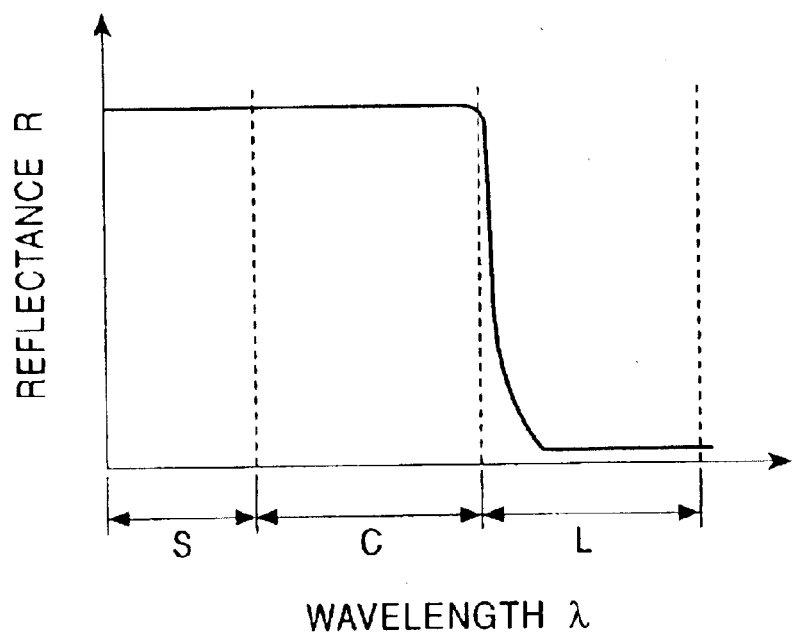
FIG. 16 is a graph showing the characteristic of the Z filter.

As shown in FIG. 16, the Z filter 102 exhibits a high reflectance over the wavelengths in the S-band and the C-band and allows only the L-band optical signal to pass through.

According to this arrangement, the Z filter 102 allows the optical signals having the wavelength of the S-band and the C-band to enter a C-band fiber amplifier 105. However, since the S-band optical signal enters the fiber amplifier 104 by the Z filter 101, only the C-band optical signal is incident on the fiber amplifier 105.

The Z filter 102 has a high reflectance over the wavelengths in the S-band, the C-band, and the L-band and reflects the optical signals in the S-band, the C-band, and the L-band.

Here, an S-band optical signal has a wavelength in the range of 1450 to 1485 nm, a C-band optical signal has a wavelength in the range of 1530 to 1560 nm, and a L-band optical signal has a wavelength in the range of 1565 to 1610 nm.

Fiber amplifiers 104 to 106 respectively perform amplification of S-band, C-band, and L-band light signals. However, their gains differ depending on the specific wavelength within each band.

Figure 17:
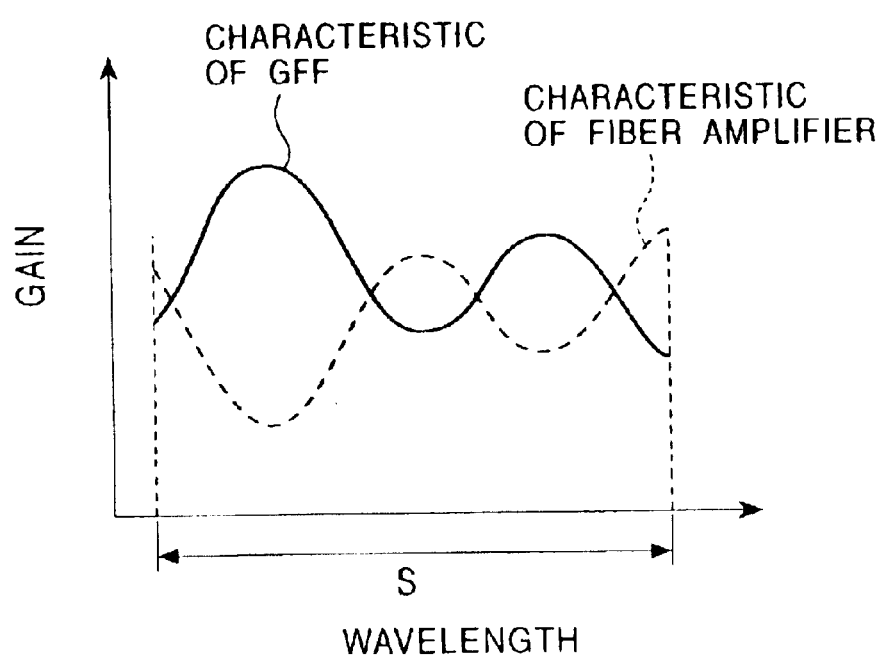
FIG. 17 is a graph showing the gain characteristics of a fiber amplifier and the GFF.

For example, as shown in FIG. 17, the gain characteristic of the fiber amplifier 105 is not constant and varies depending on the wavelength.

The GFFs 107 to 109 are optical filters having inverted gain characteristics from the gain characteristic of the fiber amplifier 105. The GFFs 107 to 109 flatten the amplified light intensity of the fiber amplifiers 104, 105, and 106, respectively.

Although the present invention has been described in this specification using embodiments and the corresponding drawings, the embodiments and drawings do not limit the scope of the invention. Various modifications are possible without departing the scope of the present invention.

According to the present invention, the determination of when to stop the deposition in deposition means, i.e., the determination as to whether the designed thickness has been reached, is usually done by thickness determining means using an optical monitor. However, when the thickness of the layer to be deposited is excessively small and is thus not measurable with the optical monitor, a crystal monitor may be used instead. In this manner, optical thin films can be accurately deposited even when the thin films have irregular thicknesses differing from film to film. Thus, no limit is imposed as to the thicknesses of the layers constituting a multilayer thin film.

Moreover, according to the present invention, the thickness determining means corrects the second thickness data output from the crystal monitor by using the first thickness data output from the optical monitor, and the deposition is controlled by measuring the deposited layer using the crystal monitor. The preset thickness of the optical monitor is set to be slightly smaller than the designed value so as to allow the correction of the second thickness data at the time the extremum is reached, and to allow the crystal monitor to detect the endpoint of the deposition. In this manner, each layer of the multilayer thin film can be formed at a high accuracy even when the thicknesses of the layers are irregular, i.e., being different from layer to layer. Thus, no limit is imposed as to the thicknesses of the layers constituting a multilayer thin film.

What is claimed is:

1. An apparatus for forming an optical thin film, comprising:

thin-film forming means for forming a thin film by depositing a substance on a surface of a substrate;

an optical monitor for optically measuring the thickness of the thin film and outputting first thickness data;

a crystal monitor for measuring the thickness of the thin film based on a crystal frequency and outputting second thickness data; and thickness determining means for controlling deposition by the thin-film forming means based on one of the first thickness data and the second thickness data by switching the optical monitor and the crystal monitor, wherein the thickness determining means corrects the second thickness data based on the first thickness data.

2. The apparatus according to claim 1, wherein the thickness determining means controls the deposition based on the first thickness data when the thickness of the thin film to be deposited is measurable with the optical monitor, and the thickness determining means controls the deposition based on the second thickness data when the thickness of the thin film to be deposited is not measurable with the optical monitor.

3. The apparatus according to claim 1, wherein the thickness determining means calculates the function of transmittance or reflectance from the first thickness data and estimates the time when the first thickness data output from the optical monitor coincides with a designed thickness data by multinomial regression over the calculated function.

4. The apparatus according to claim 1, wherein the thickness determining means calculates the function of transmittance or reflectance from the first thickness data and estimates the time when the first thickness data output from the optical monitor coincides with a designed thickness data according to changes in slope data obtained from regression calculation over the calculated function.

5. A method for forming an optical thin film comprising:
a thin-film forming step of forming a thin film by depositing a substance on a surface of a substrate;
an optical monitoring step of optically measuring the thickness of the thin film so as to obtain first thickness data;
a crystal monitoring step of measuring the thickness of the thin film based on a crystal frequency so as to obtain second thickness data; and
a thickness determining step of controlling the deposition during the thin-film forming step based on one of the first thickness data and the second thickness data by switching between the first thickness data and the second thickness data,
wherein the thickness determining means corrects the second thickness data based on the first thickness data.

6. The method according to claim 5, wherein, in the thickness determining step, the first thickness data is used when the thickness of the thin film to be deposited is measurable with an optical monitor, and the second thickness data is used when the thickness of the thin film to be deposited is not measurable with the optical monitor.

7. An optical filter comprising a plurality of thin films made using the apparatus according to claim 1.

8. An optical filter comprising a plurality of thin films made by the method according to claim 5.

9. An apparatus for forming an optical thin film, comprising:
thin-film forming means for forming a thin film by depositing a substance on a surface of a substrate;
an optical monitor for optically measuring the thickness of the thin film and outputting first thickness data;
a crystal monitor for measuring the thickness of the thin film based on a crystal frequency and outputting second thickness data; and
thickness determining means for controlling the deposition of the thin-film forming means, wherein the thickness determining means corrects the second thickness data by using the first thickness data and controls the deposition of the depositing means based on the corrected second thickness data.

10. The apparatus according to claim 9, wherein the thickness determining means has a first preset data of the first thickness data and a second preset data of the second thickness data used in determining the thickness, wherein the first preset data is smaller than the second preset data.

11. The apparatus according to claim 9, wherein the thickness determining means calculates the function of transmittance or reflectance from the first thickness data and estimates the time when the first thickness data output from the optical monitor coincides with a designed thickness data by multinomial regression over the calculated function.

12. The apparatus according to claim 9, wherein the thickness determining means calculates the function of transmittance or reflectance from the first thickness data and estimates the time when the first thickness data output from the optical monitor coincides with a designed thickness data according to changes in slope data obtained from regression calculation over the calculated function.

13. A method for forming an optical thin film, comprising:
a thin-film forming step of depositing a material on a surface of a substrate to form a thin film;
an optical monitoring step of optically measuring the thickness of the thin film so as to obtain first thickness data;
a crystal monitoring step of measuring the thickness of the thin film based on a frequency so as to obtain second thickness data; and
a thickness determining step of controlling the deposition during the thin-film forming step, in which the second thickness data is corrected by the first thickness data, and the deposition during the thin-film forming step is controlled based on the corrected second thickness data.

14. The method according to claim 13, wherein, during the thickness determining step, a first preset data of the first thickness data for determining the thickness is smaller than a second preset data of the second thickness data.

15. An optical filter comprising a plurality of thin films made using the apparatus according to claim 9.

16. An optical filter comprising a plurality of thin films made by the method according to claim 13.

17. The apparatus according to claim 1, wherein the thickness determining means uses the first thickness data when the thickness of the optical thin film to be formed is measurable with the optical monitor,
the thickness determining means uses the second thickness data when the thickness of the thin film is so small that it is inadequate to measure with the optical monitor, and
the second thickness data is corrected based on the first thickness data immediately before switching from the first thickness data to the second thickness data.

18. The apparatus according to claim 6, wherein the thickness determining means uses the first thickness data when the thickness of the optical thin film to be formed is measurable with the optical monitor,
the thickness determining means uses the second thickness data when the thickness of the thin film is so small that it is inadequate to measure with the optical monitor, and
the second thickness data is corrected based on the first thickness data immediately before switching from the first thickness data to the second thickness data.

19. The apparatus according to claim 9, wherein the thickness determining means uses the first thickness data when the thickness of the optical thin film to be formed is measurable with the optical monitor,
the thickness determining means uses the second thickness data when the thickness of the thin film is so small that it is inadequate to measure with the optical monitor, and
the second thickness data is corrected based on the first thickness data immediately before switching from the first thickness data to the second thickness data.

20. The apparatus according to claim 13, wherein the thickness determining means uses the first thickness data when the thickness of the optical thin film to be formed is measurable with the optical monitor,
the thickness determining means uses the second thickness data when the thickness of the thin film is so small that it is inadequate to measure with the optical monitor, and
the second thickness data is corrected based on the first thickness data immediately before switching from the first thickness data to the second thickness data.

* * * * *